US012787625B2

(12) United States Patent
Park et al.

(10) Patent No.: US 12,787,625 B2
(45) Date of Patent: Nov. 3, 2026

(54) LIGHT EMITTING DISPLAY DEVICE

(71) Applicant: LG Display Co., Ltd., Seoul (KR)

(72) Inventors: Ji Yeon Park, Paju-si (KR); Dae Yun Han, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 185 days.

(21) Appl. No.: 18/921,490

(22) Filed: Oct. 21, 2024

(65) Prior Publication Data

US 2025/0143157 A1 May 1, 2025

(30) Foreign Application Priority Data

Oct. 27, 2023 (KR) ........................ 10-2023-0145519

(51) Int. Cl.
*H10K 59/88* (2023.01)
*H10K 102/00* (2023.01)

(52) U.S. Cl.
CPC ....... *H10K 59/88* (2023.02); *H10K 2102/351* (2023.02)

(58) Field of Classification Search
CPC ......................... H10K 59/88; H10K 2102/351
See application file for complete search history.

(56) References Cited

U.S. PATENT DOCUMENTS 9,929,222 B2 * 3/2018 Lim .................... H10K 59/121
2017/0084875 A1 * 3/2017 Joung .................. H10K 59/124
2022/0208913 A1 * 6/2022 Lee ...................... H10K 59/122

FOREIGN PATENT DOCUMENTS

KR 10-2020-0082497 A 7/2020
KR 10-2022-0049376 A 4/2022

* cited by examiner

*Primary Examiner* — Anne M Hines
(74) *Attorney, Agent, or Firm* — Morgan, Lewis & Bockius LLP

(57) ABSTRACT

A light emitting display device including a substrate including first and second subpixels, a first insulating layer on the substrate, a first anode including first lower and upper electrodes on the first insulating layer at the first subpixel, a second anode including second lower and upper electrodes spaced from each other by the first insulating layer at the second subpixel, a first electrode pattern at non-emission areas and spaced from the first lower electrode, and a second electrode pattern spaced from the second lower electrode to overlap the first electrode pattern. A first vertical distance from an upper surface of the substrate to an upper surface of the first electrode pattern may be greater than a second vertical distance from the upper surface of the substrate to an upper surface of the first upper electrode.

20 Claims, 14 Drawing Sheets

LIGHT EMITTING DISPLAY DEVICE

CROSS-REFERENCE TO RELATED APPLICATIONS

This application claims the benefit of and the priority to Korean Patent Application No. 10-2023-0145519, filed on Oct. 27, 2023, which is hereby incorporated by reference as if fully set forth herein.

BACKGROUND

Technical Field

The present disclosure relates to a light emitting display device, and more particularly, to a light emitting display device which may prevent leakage current from flowing to adjacent subpixels and prevent occurrence of voids between adjacent subpixels.

Description of the Related Art

As society enters the information age, the field of display devices that visually display electrical information signals is developing rapidly. Accordingly, various display devices, such as liquid crystal displays (LCDs) and organic light-emitting diode (OLED) displays, have been developed and applied to various fields.

Thereamong, a light emitting display device includes light emitting elements which are self-luminous elements, and does not require any separate light source used in non-light-emitting elements, thereby making it possible to reduce weight and thickness.

A light emitting element includes an intermediate layer between a first electrode and a second electrode, and emits light by applying an electric field between the first electrode and the second electrode.

In such a light emitting display device including these light emitting elements, some subpixels among a plurality of subpixels may emit light due to leakage current flowing from adjacent subpixels.

SUMMARY

Accordingly, the present disclosure is directed to a light emitting display device that substantially obviates one or more problems due to limitations and disadvantages of the related art.

An object of the present disclosure is to provide a light emitting display device which may prevent leakage current from flowing to adjacent subpixels.

Another object of the present disclosure is to provide a light emitting display device which may prevent occurrence of voids between adjacent subpixels while completely disconnecting a path through which leakage current flows between adjacent subpixels.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

A light emitting display device according to the present disclosure may have electrode patterns formed as the same layers as lower electrodes of anodes of subpixels in non-emission areas between emission areas of adjacent subpixels and thus create a step between the non-emission areas and the emission areas. Accordingly, in the light emitting display device according to the present disclosure, because an intermediate layer and a first dummy pattern are located at different heights, even if there is a region in which the intermediate layer and the first dummy pattern come into contact with each other, it is possible to prevent corresponding layers in the intermediate layer and the first dummy pattern from coming into contact with each other, and thus, it is possible to prevent leakage current between adjacent subpixels from flowing through common layers in the intermediate layer, which are formed through deposition using common masks.

Further, the light emitting display device according to the present disclosure has an undercut formed under the electrode pattern in contact with the first dummy pattern formed as the same layer as the intermediate layer between adjacent subpixels, thereby being capable of preventing occurrence of voids between the intermediate layer in the emission areas and the first dummy pattern in the non-emission areas.

To achieve these objects and other advantages and in accordance with objects of the disclosure, as embodied and broadly described herein, a light emitting display device may comprise a substrate comprising a first subpixel and a second subpixel to have an emission area and a non-emission area, respectively, a first insulating layer on the substrate, a first anode comprising a first lower electrode and a first upper electrode over the first insulating layer at the first subpixel, a second anode comprising a second lower electrode and a second upper electrode spaced from each other by the first insulating layer interposed therebetween at the second subpixel, a first electrode pattern provided at the non-emission areas, spaced from the first lower electrode, and comprising a same layer as the first lower electrode and a second electrode pattern spaced from the second lower electrode, overlapping the first electrode pattern, and comprising a same layer as the second lower electrode. A first vertical distance from an upper surface of the substrate where the first electrode pattern and the second electrode pattern overlap each other to an upper surface of the first electrode pattern may be greater than a second vertical distance from the upper surface of the substrate to an upper surface of the first upper electrode at the emission area.

It is to be understood that both the foregoing general description and the following detailed description of the present disclosure are by way of example and are intended to provide further explanation of the disclosure.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1A:
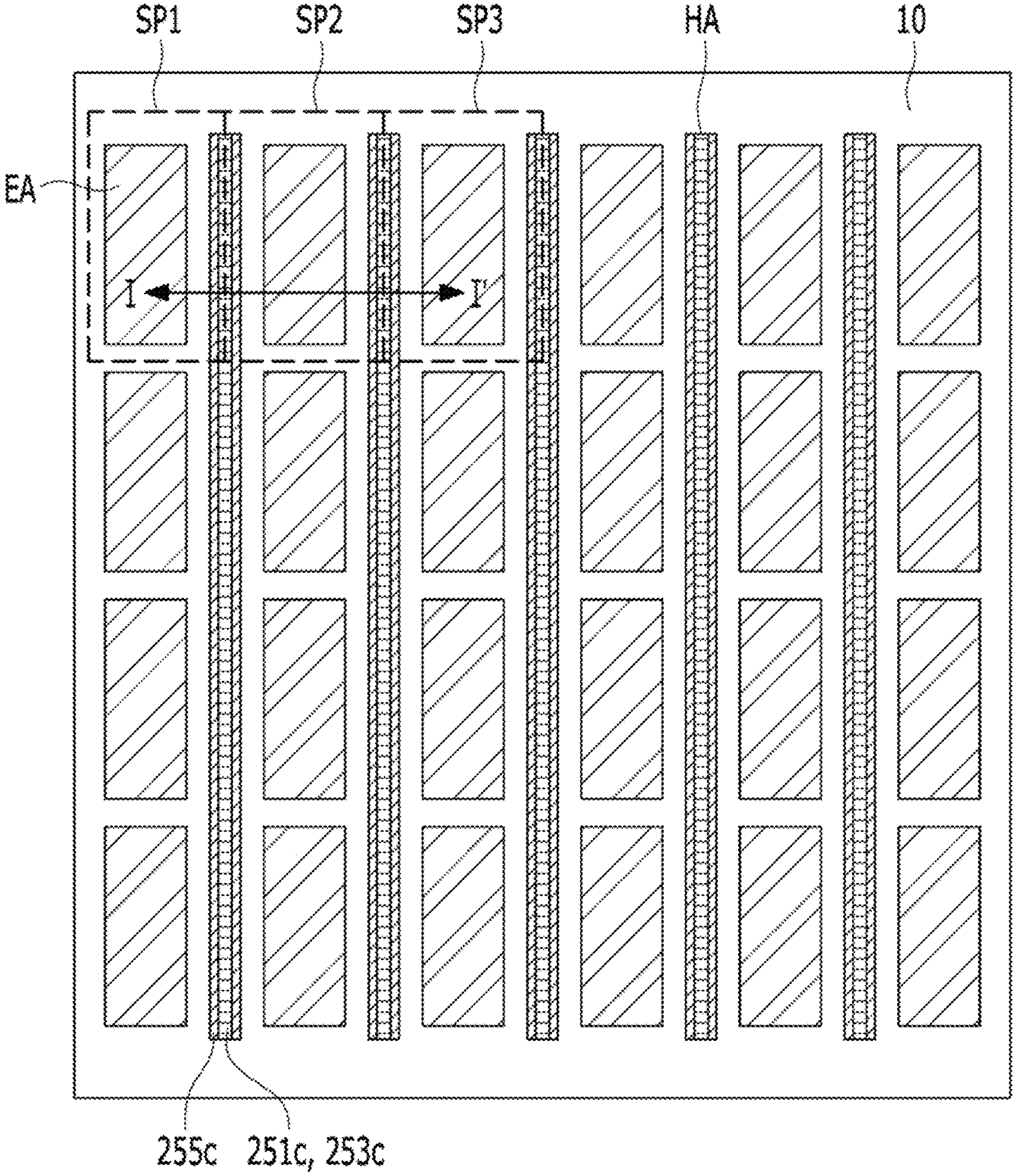
FIG. 1A is a plan view of a light emitting display device according to a first embodiment of the present disclosure.

The advantages and features of the present disclosure and methods of accomplishing the same will be clearly understood from the following preferred embodiments with reference to the attached drawings. However, the present disclosure is not limited to the embodiments, and may be embodied in different forms. The embodiments are suggested only to offer a thorough and complete understanding of the disclosed context and to sufficiently inform those skilled in the art of the technical concept of the present disclosure and embodiments of the present disclosure are only defined by the scope of the claims.

The shape, size, ratio, angle, number, and the like shown in the drawings to illustrate various embodiments of the present disclosure are merely provided for illustration, and the disclosure is not limited to the content shown in the drawings. Wherever possible, the same reference numbers will be used throughout the drawings to refer to the same or like parts. In the following description, detailed descriptions of technologies or configurations related to the present disclosure may be omitted so as to avoid unnecessarily obscuring the subject matter of the present disclosure.

When terms such as "including", "having", and "comprising" are used throughout the disclosure, an additional component may be present, unless "only" is used. A component described in a singular form encompasses a plurality thereof unless particularly stated otherwise.

The components included in the embodiments of the present disclosure should be interpreted to include an error range, even if there is no additional particular description thereof.

In describing the variety of embodiments of the present disclosure, when terms describing positional relationships such as "on", "above", "under" and "next to" are used, at least one intervening element may be present between the two elements, unless "immediately" or "directly" is also used.

In describing the variety of embodiments of the present disclosure, when terms related to temporal relationships, such as "after", "subsequently", "next", and "before", are used, the non-continuous case may be included, unless "immediately" or "directly" is also used.

In describing the variety of embodiments of the present disclosure, terms such as "first" and "second" may be used to describe a variety of components, but these terms only aim to distinguish the same or similar components from one another. Accordingly, throughout the disclosure, a "first" component may be the same as a "second" component within the technical concept of the present disclosure, unless specifically mentioned otherwise.

The terms "first horizontal axis direction", "second horizontal axis direction", and "vertical axis direction" should not be interpreted as only geometric relationships in which the relationship between each other is vertical, and as having a broader range of direction as long as the configuration of the present disclosure can serve functionally.

The term "at least one" should be understood to include all possible combinations of one or more related items. For example, "at least one of the first, second, and third items" means each of the first, second, or third items, as well as any combination of two or more of the first, second, and third items.

Features of various embodiments of the present disclosure may be partially or completely coupled to or combined with each other, and may be variously inter-operated with each other and driven technically. The embodiments of the present disclosure may be carried out independently from each other, or may be carried out together in an interrelated manner.

In adding reference numerals to components in each drawing, identical components may have the same reference numerals as much as possible even if they are shown in different drawings. In addition, the scale of the components shown in the attached drawings has a different scale from the actual scale for convenience of explanation and is thus not limited to the scale shown in the drawings.

Hereinafter, exemplary examples of light emitting display devices according to embodiments of the present disclosure will be described in detail with reference to the accompanying drawings.

Figure 1B:
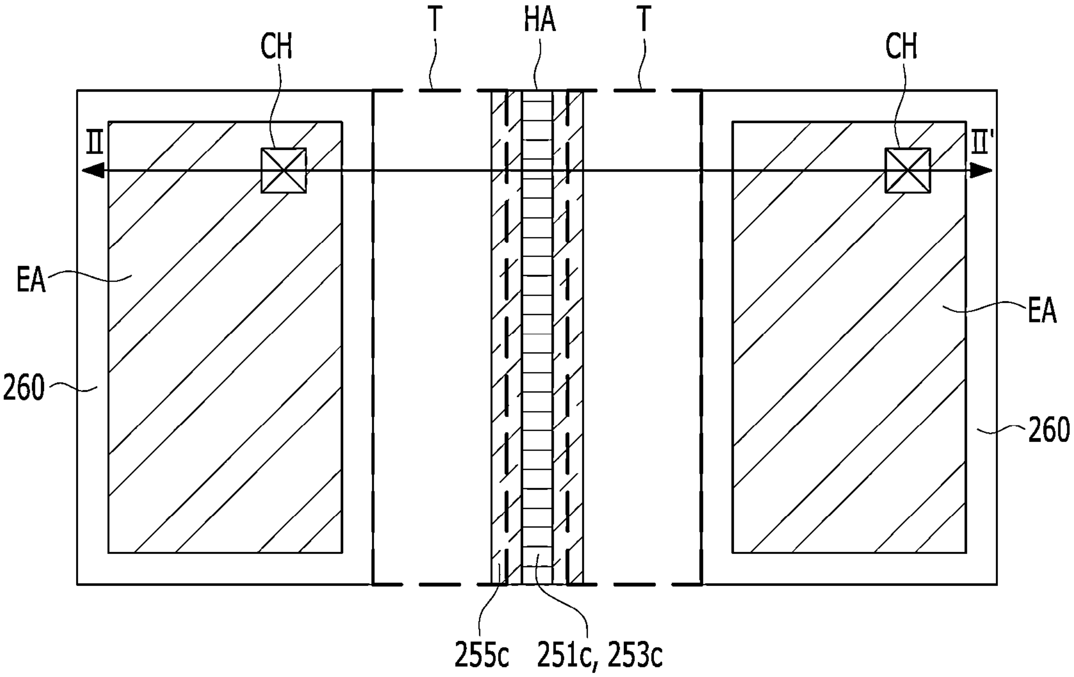
FIG. 1B is an enlarged plan view of a portion of FIG. 1A.
Figure 2:
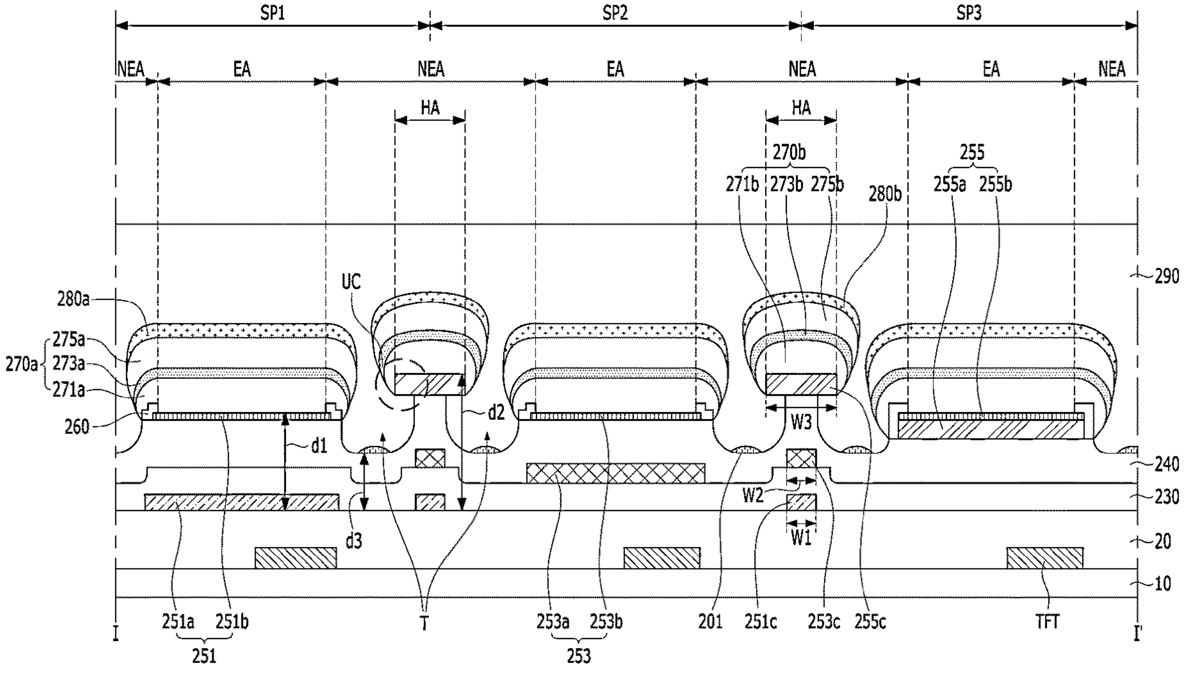
FIG. 2 is a cross-sectional view taken along line I-I' of FIG. 1A.
Figure 3:
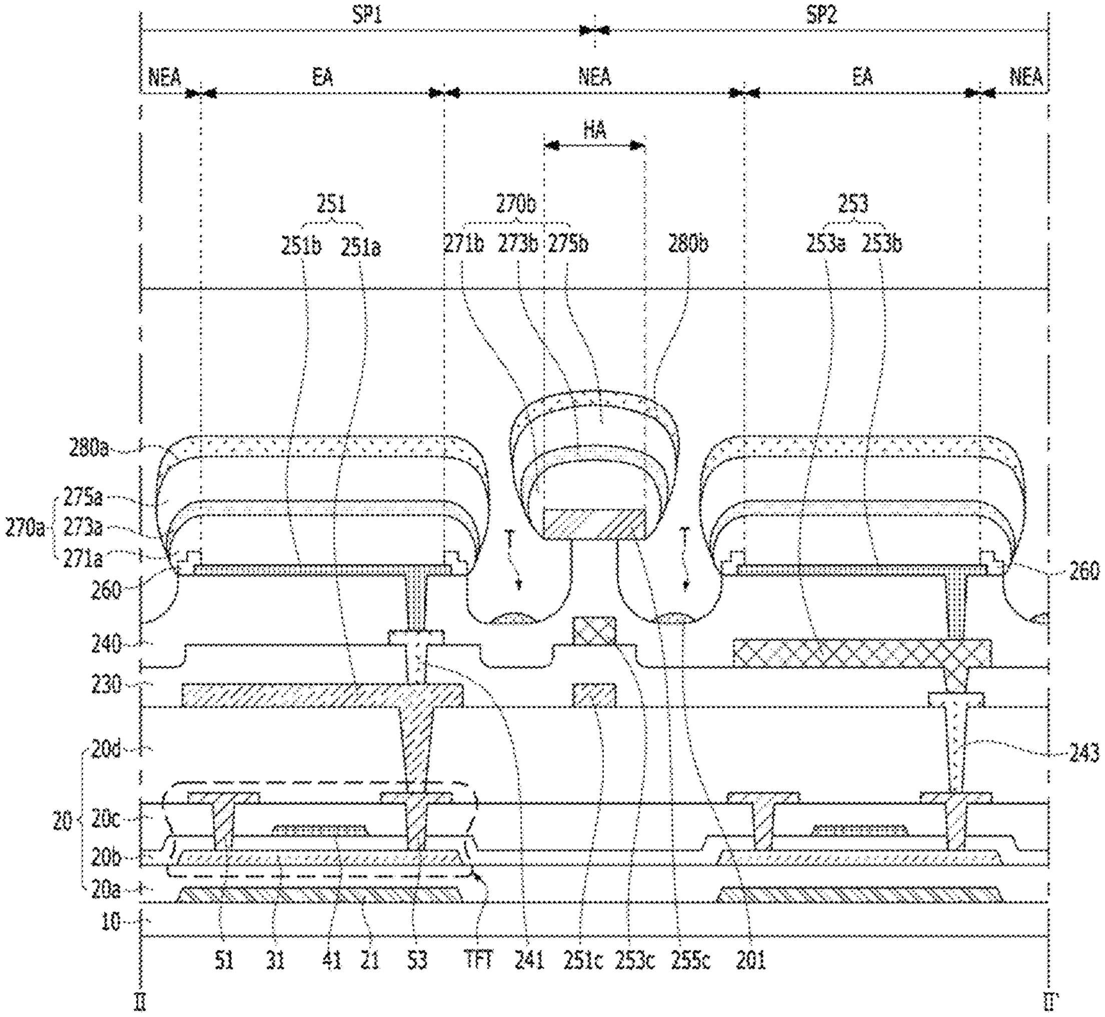
FIG. 3 is a cross-sectional view taken along line II-II' of FIG. 1B.

FIG. 1A is a plan view of a light emitting display device according to a first embodiment of the present disclosure, and FIG. 1B is an enlarged plan view of a portion of FIG. 1A. FIG. 2 is a cross-sectional view taken along line I-I' of FIG. 1A. FIG. 3 is a cross-sectional view taken along line II-II' of FIG. 1B.

With reference to FIGS. 1A and 1B, the light emitting display device according to the first embodiment of the present disclosure may include a plurality of subpixels including first subpixels SP1, second subpixels SP2, and third subpixels SP3, each of which has an emission area EA on a substrate 10, and step areas HA between the emission areas of the respective subpixels.

The plurality of subpixels may be defined by gate lines and data lines which intersect each other to be formed in a matrix on the substrate 10 within an active area. The first to third subpixels SP1, SP2, and SP3 may form one pixel, and be regularly arranged on the substrate 10. For example, the first to third subpixels SP1, SP2, and SP3 are arranged to be spaced apart from each other in the row direction, and pixels, each of which is formed by the first to third subpixels SP1, SP2, and SP3, may be arranged repeatedly in the row and column directions. That is, a plurality of first subpixels SP1 may be arranged in the column direction, a plurality of second subpixels SP2 may be spaced apart from the first subpixels SP1 in the row direction and be arranged in the column direction parallel with the first subpixels SP1, and a plurality of third subpixels SP3 may be spaced apart from the second subpixels SP2 in the row direction and be arranged in the column direction parallel with the second subpixels SP2. However, the present disclosure is not limited thereto, and the first to third subpixels SP1, SP2, and SP3 may be provided in various arrangements.

Such a substrate 10 may be glass or a flexible plastic substrate. For example, when the substrate 10 is a plastic substrate, it may contain polyimide or polyamide. In one embodiment, the substrate 10 may have an inorganic layer between polyimide films.

Each of the first to third subpixels SP1, SP2, and SP3 may include the emission area EA. The respective emission areas EA of the first to third subpixels SP1, SP2, and SP3 may emit light of different colors. For example, the emission area EA corresponding to the first subpixel SP1 may emit red light, the emission area EA corresponding to the second subpixel SP2 may emit green light, and the emission area EA corresponding to the third subpixel SP3 may emit blue light. In this case, the emission area EA corresponding to the third subpixel SP3 may emit light having the shortest color wavelength compared to the other emission areas EA1 and EA2. However, the present disclosure is not limited thereto, and the plurality of subpixels may further include a subpixel which emits white light.

The step area HA may be provided in a non-emission area NEA between the emission areas EA of the respective subpixels. The step areas HA may have a higher step than the emission areas EA because more layers are stacked in the step areas HA than the emission areas EA. Therefore, the step areas HA may separate materials for an intermediate layer 270*a* (in FIG. 2) and a material for a cathode 280*a* (in FIG. 2) which are deposited throughout the substrate 10. That is, the intermediate layer 270*a* and the cathode on the emission areas EA, and a first dummy pattern 270*b* (in FIG. 2) and a second dummy pattern 280*b* (in FIG. 2) on the step areas HA may be separated from each other by the step areas HA.

For this purpose, the step area HA according to the first embodiment may be provided with a first electrode pattern 251*c*, a second electrode pattern 253*c*, and a third electrode pattern 255*c* on the substrate 10. The first to third electrode patterns 251*c*, 253*c*, and 255*c* may be sequentially provided in a direction away from the substrate 10, and may overlap each other. Here, the third electrode pattern 255*c* located at the uppermost end of the substrate 10 may have a greater width than each of the first and second electrode patterns 251*c* and 253*c*. Further, the first and second electrode patterns 251*c* and 253*c* according to the first embodiment may have the same width. Also, the first and second electrode patterns 251*c* and 253*c* may be located within an area where the third electrode pattern 255*c* is provided. Accordingly, the step area HA may be defined as an area which overlaps the first to third electrode patterns 251*c*, 253*c*, and 255*c* and is provided with the third electrode pattern 255*c*.

The step areas HA may be provided between the first to third subpixels SP1, SP2, and SP3 which emit light of different colors. If each of the first to third subpixels SP1, SP2, and SP3 is arranged in the column direction, the step areas HA may be provided in the column direction between the respective subpixels SP1, SP2, and SP3. However, the present disclosure is not limited thereto, and the positions of the step areas HA may vary depending on the arrangement structure of the first to third subpixels SP1, SP2, and SP3. For example, if subpixels which emit light of different colors are arranged vertically in the row and column directions, the step areas HA may be arranged in both the row and column directions between the different subpixels.

Both ends of the step areas HA in the column direction may be spaced apart from other step areas HA. That is, in the present disclosure, the step areas HA may be provided between subpixels emitting light of different colors to prevent leakage current between adjacent subpixels, and in this case, the step areas HA may be formed discontinuously. Thereby, in the present disclosure, the cathode 280*a* configured to supply common power to the subpixels SP1, SP2, and SP3 may be formed integrally on the entire surface of the substrate 10 through deposition using a common mask.

Further, the step areas HA may be provided to be spaced apart from the emission area EA of each of the first to third subpixels SP1, SP2, and SP3. In addition, a trench T may be provided between the emission area EA of each of the subpixels SP1, SP2, and SP3, and the step area HA. The trench T according to the first embodiment may have an area which overlaps at least the step area HA. Further, the area in which the trench T and the step area HA overlap may be provided along the edge of the step area HA facing the emission area EA.

Although FIG. 1B shows the trench T as not overlapping a bank 260, the trench T may overlap the bank 260 depending on a process method. In this case, the trench T may have an area which overlaps the edge of the bank 260 facing the step area HA. Further, the trench T may be basically provided along the bank 260 around the emission areas EA to partition the emission areas EA from each other.

The bank 260 may be provided along the edge of the emission area EA. Further, the bank 260 may overlap at least a contact hole CH. As such, the emission area EA may be defined as an area which is exposed by the bank 260. In addition, the contact hole CH may be provided in the emission area EA.

With reference to FIG. 2, the light emitting display device according to the first embodiment of the present disclosure may include a transistor TFT, a light emitting element connected to the transistor TFT, the bank 260 configured to expose the emission area EA of the light emitting element, and a sealing layer 290, in each of the first to third subpixels SP1, SP2, and SP3 on the substrate 10. In addition, the light emitting display device according to the first embodiment of the present disclosure may have the first to third electrode patterns 251*c*, 253*c*, and 255*c*, the first dummy pattern 270*b*, and the second dummy pattern 280*b* in the non-emission areas NEA between the emission areas EA.

The substrate 10 may have the plurality of subpixels SP1, SP2, and SP3. The plurality of subpixels SP1, SP2, and SP3 may include the emission area EA where light is actually emitted, and the non-emission area NEA around the emission area EA where light is not emitted. In the present disclosure, the total thickness of components between the substrate 10 corresponding to the non-emission areas NEA and the first dummy pattern 270*b* is greater than the total thickness of components between the substrate 10 corresponding to the emission areas EA and the intermediate layer 270*a*, and the light emitting display device may include the step areas HA in the non-emission areas NEA.

The transistor TFT may be provided in each of the subpixels SP1, SP2, and SP3 on the substrate 10. With reference to FIG. 3, the transistor TFT includes an active layer 31, a gate electrode 41 which overlaps the channel region of the active layer 31 with a gate insulating film 20*b* interposed therebetween, and a source electrode 51 and a drain electrode 53 connected to both sides of the active layer 31.

The active layer 31 of the transistor TFT has a source region and a drain region on both sides of the channel region. Each of the source region and the drain region is formed of a semiconductor material implanted with n-type or p-type impurities. The channel region overlapping the gate electrode 41 may be formed of a semiconductor material into which n-type or p-type impurities are not implanted.

The gate electrode 41 of the transistor TFT may be provided to have the same width as the channel region of the active layer 31 to overlap the channel region of the active layer 31 with the gate insulating film 20*b* interposed therebetween. For example, the gate electrode 41 may be a single layer or a multilayer formed of at least one of molybdenum (Mo), aluminum (Al), chromium (Cr), gold (Au), titanium (Ti), nickel (Ni), neodymium (Nd), or copper (Cu), or an alloy thereof. The gate insulating film 20*b* may be formed of an inorganic insulating material, for example, may be a silicon oxide ($SiO_x$) film, a silicon nitride ($SiN_x$) film, a silicon oxynitride ($SiO_xN_y$) film, or a multilayer film thereof.

A light-shielding layer 21 on the substrate 10 may be disposed below the active layer 31 to overlap at least the channel region of the active layer 31 of the transistor TFT. The light-shielding layer prevents external light from penetrating the substrate 10 and being transmitted to the transistor TFT. For example, the light-shielding layer 21 may be formed as a single layer of a metal material, such as molybdenum (Mo), titanium (Ti), aluminum-neodymium (AlNd), aluminum (Al), or chromium (Cr), or an alloy thereof, or as a multilayer structure using the same.

A buffer film 20*a* on the light-shielding layer 21 is provided to cover the light-shielding layer 21. For example, the buffer film 20*a* may be formed as a single-layer structure or a multilayer structure using silicon oxide ($SiO_x$) or silicon nitride ($SiN_x$).

An interlayer insulating film 20*c* on the gate insulating film 20*b* may include a source contact hole and a drain contact hole configured to expose each of the source and drain regions of the active layer 31, and may be provided to cover the gate electrode 41. For example, the interlayer insulating film 20*c* may be formed of an inorganic insulating material. For example, the interlayer insulating film 20*c* may be formed as a single layer of a silicon oxide ($SiO_x$) film, a silicon nitride ($SiN_x$) film, or a silicon oxynitride ($SiO_xN_y$) film, or as a multilayer structure using the same.

The source electrode 51 and the drain electrode 53 may be provided as the same layer on the interlayer insulating film 20*c*. The source electrode 51 and the drain electrode 53 are connected to the source region and the drain region of the active layer 31 through the source contact hole and the drain contact hole, respectively. For example, the source electrode 51 and the drain electrode 53 may be formed as a single layer formed of a metal material, such as molybdenum (Mo), aluminum (Al), chromium (Cr), gold (Au), titanium (Ti), nickel (Ni), neodymium (Nd), copper (Cu), or an alloy thereof, or as a multilayer structure using the same.

A passivation layer 20*d* on the interlayer insulating film 20*c* may be provided to cover the transistor TFT. Thereby, the transistor TFT may be protected by the passivation layer 20*d*. For example, the passivation layer 20*d* is a type of inorganic insulating film, and may be provided as a single layer or multiple layers of a silicon oxide ($SiO_x$) film, a silicon nitride ($SiN_x$) film, or a silicon oxynitride ($SiO_xN_y$) film.

A planarization layer may be provided on the passivation layer 20*d*. The planarization layer may have a thickness sufficient to flatten surface steps on the upper part of the transistor TFT, and may comprise an organic insulating film. In an embodiment of the present disclosure, when the planarization layer can be replaced with the passivation layer 20*d*. The planarization layer can protect the transistor TFT. For example, the planarization layer may be selected from one of photo acryl, polyimide, a benzocyclobutene resin, and acrylate. The planarization layer may be formed as multiple layers, in some cases. In an embodiment of the present disclosure, the passivation layer 20*d* may be omitted.

In a light emitting display device according to an embodiment of the present disclosure, the first lower electrode 251*a* at the emission area EA, and the first electrode pattern 251*c* can be positioned above a transistor array 20. And the first lower electrode 251*a* at the emission area EA, and the first electrode pattern 251*c* can be positioned on a same uppermost surface of the transistor array 20. Thus, each base surface of a first vertical distance d1, a second vertical distance d2 and a third vertical distance d3 from the upper surface of the substrate 10 hereinafter can be the same uppermost surface of the transistor array 20. Herein a vertical distance from an upper surface of the substrate to an upper surface of the passivation layer 20*d* can be the same at the emission area EA and the non-emission area EA.

With reference to FIGS. 2 and 3, the light emitting element including a stack structure of an anode 251, 253, or 255, the intermediate layer 270*a*, and the cathode 280*a* may be provided in each of the emission areas EA on the transistor array 20 including the buffer film 20*a*, the gate insulating film 20*b*, the interlayer insulating film 20*c*, the passivation layer 20*d*, and the planarization layer. The first to third electrode patterns 251*c*, 253*c*, and 255*c*, the first dummy pattern 270*b*, and the second dummy pattern 280*b* may be provided in the non-emission areas NEA between the emission areas EA, corresponding to the step areas A spaced apart from the emission areas EA.

A first anode 251, a second anode 253, and a third anode 255 corresponding to the first subpixel SP1, the second subpixel SP2, and the third subpixel SP3, respectively, may be provided on the transistor array 20. The first anode 251 may include a first lower electrode 251*a* and a first upper electrode 251*b*, the second anode 253 may include a second lower electrode 253*a* and a second upper electrode 253*b*, and the third anode 255 may include a third lower electrode 255*a* and a third upper electrode 255*b*. The lower electrodes 251*a*, 253*a*, and 255*a* of the first to third anodes 251, 253, and 255 may have a higher reflectance than the upper electrodes 251*b*, 253*b*, and 255*b*, respectively. Here, in general, the lower electrodes 251*a*, 253*a*, and 255*a* of the first to third anodes 251, 253, and 255 may have a higher reflectance than the upper electrodes 251*b*, 253*b*, and 255*b*, respectively and may have a greater thickness than the upper electrodes 251*b*, 253*b*, and 255*b*, respectively, in order to adjust a resonance distance with the cathode 280*a*. For example, the lower electrodes 251*a*, 253*a*, and 255*a* may be formed of silver (Ag), aluminum (Al), magnesium (Mg), calcium (Ca), or an alloy thereof to have a thickness sufficient to reflect incident light. The upper electrodes 253*b*, 253*b*, and 255*b* may be formed of a transparent conductive film including a material having a relatively high work function value, such as indium tin oxide (ITO) or indium zinc oxide (IZO).

Insulating layers having different thicknesses may be interposed between the lower electrodes 251*a*, 253*a*, and 255*a* and the upper electrodes 251*b*, 253*b*, and 255*b* so that the first to third anodes 251, 253, and 255 may have different resonance distances corresponding to the first to third subpixels SP1, SP2, and SP3 which emit light of different colors, respectively. For example, the first anode 251 may configure the first subpixel SP1 to emit red light, the second anode 253 may configure the second subpixel SP2 to emit green light, and the third anode 255 may configure the third subpixel SP3 to emit blue light.

A first insulating layer 230 and a second insulating layer 240 interposed between the first to third lower electrodes 251*a*, 253*a*, and 255*a* and the first to third upper electrodes 251*b*, 253*b*, and 255*b* of the first to third anodes 251, 253, and 255 may be formed of a type of inorganic insulating film and/or a type of organic insulating film. Thereamong, at least the second insulating layer 240 is a type of inorganic insulating film, and may be formed of a silicon oxide ($SiO_x$) film, a silicon nitride ($SiN_x$) film, or a silicon oxynitride ($SiO_xN_y$) film. An insulating layer formed of an inorganic insulating film has the characteristic of being formed along the steps of components, thereby being capable of maintaining steps between the emission areas EA and the non-emission areas NEA.

The first lower electrode 251*a* of the first anode 251 may be provided on the upper surface of the transistor array 20. In addition, the first electrode pattern 251*c* of the same layer as the first lower electrode 251*a* may be provided on the upper surface of the transistor array 20 in each of the non-emission areas NEA between adjacent subpixels SP1, SP2, and SP3. Here, the first lower electrode 251*a* and the first electrode pattern 251*c* may be spaced apart from each other. With reference to FIG. 3, a connection electrode 243 of the same layer as the first lower electrode 251*a* may be provided on the upper surface of the transistor array 20 in each of the second and third subpixels SP2 and SP3. The connection electrode 243 may be configured to connect the second or third anode 253 or 255 of each of the second and third subpixels SP2 and SP3 to the corresponding transistor.

The first upper electrode 251*b* of the first anode 251 may be spaced apart from the first lower electrode 251*a* by the first insulating layer 230 and the second insulating layer 240 interposed therebetween. That is, the first upper electrode 251*b* may be provided on the second insulating layer 240.

The second lower electrode 253*a* of the second anode 253 may be provided on the upper surface of the first insulating layer 230. In addition, the second electrode pattern 253*c* of the same layer as the second lower electrode 253*a* may be provided on the upper surface of the first insulating layer 230 in each of the non-emission areas NEA between the adjacent subpixels SP1, SP2, and SP3. Here, the second lower electrode 253*a* and the second electrode pattern 253*c* may be spaced apart from each other. Further, the second width W2 of the second electrode pattern 253*c* may be the same as the first width W1 of the first electrode pattern 251*c*, and the first electrode pattern 251*c* and the second electrode pattern 253*c* may overlap each other. With reference to FIG. 3, a connection electrode 241 of the same layer as the second lower electrode 253*a* may be provided on the upper surface of the first insulating layer 230 in each of the first and third subpixels SP1 and SP3. The connection electrode 241 may be configured to connect the first or third anode 251 or 255 of each of the first and third subpixels SP1 and SP3 to the corresponding transistor.

The second upper electrode 253*b* of the second anode 253 may be spaced apart from the second lower electrode 253*a* by the second insulating layer 240 interposed therebetween. That is, the second upper electrode 253*b* may be provided on the second insulating layer 240.

The third lower electrode 255*a* of the third anode 255 may be provided on the upper surface of the second insulating layer 240. In addition, the third electrode pattern 255*c* of the same layer as the third lower electrode 255*a* may be provided on the upper surface of the second insulating layer 240 in each of the non-emission areas NEA between the adjacent subpixels SP1, SP2, and SP3. Here, the third lower electrode 255*a* and the third electrode pattern 255*c* may be spaced apart from each other. Further, the third width W3 of the third electrode pattern 255*c* may be greater than the first width W1 of the first electrode pattern 251*c* and the second width W2 of the second electrode pattern 253*c*, and may overlap both the first electrode pattern 251*c* and the second electrode pattern 253*c*.

The third upper electrode 255*b* of the third anode 25 may be in contact with the third lower electrode 255*a* without an insulating layer interposed therebetween. However, the present disclosure is not limited thereto, and an insulating layer may be further provided between the third lower electrode 255*a* and the third upper electrode 255*b* to adjust the resonance distance.

The material for the cathode 280*a* facing the anodes 251, 253, and 255 may be provided on the intermediate layer 270*a* and the first dummy pattern 270*b* over the entire surface of the substrate 10. The light emitting display device according to the present disclosure has an undercut UC in the step areas HA in the non-emission areas NEA, and thus, the materials for the cathode 280*a* may be separated into the cathode 280*a* overlapping the emission areas EA and the second dummy pattern 280*b* overlapping the step areas HA, and may be included in a third dummy pattern 201 between the emission areas EA and the step areas HA. The cathode 280*a* of the present disclosure may be formed as a transflective electrode which transmits a part of light and reflects the other part of light. The cathode 280*a* may have a lower transmittance than the upper electrodes 251*b*, 253*b*, and 255*b* and a higher transmittance than the lower electrodes 251*a*, 253*a*, and 255*a*. For example, the cathode 280*a* may be formed of silver (Ag), aluminum (Al), magnesium (Mg), calcium (Ca), or an alloy thereof to have a thickness sufficient to transmit light.

In the emission areas EA, a micro-cavity effect may occur between the anodes 251, 253, and 255 and the cathode 280*a*. The first to third lower electrodes 251*a*, 253*a*, and 255*a* of the first to third anodes 251, 253, and 255 may be formed as reflective electrodes, the first to third upper electrodes 251*b*, 253*b*, and 255*b* may be formed as transparent electrodes, and the cathode 280*a* may be formed as a transflective electrode. In this case, a part of light emitted from the intermediate layer 270*a* may travel toward the cathode 280*a*, and the other part of the light may pass through the first to third upper electrodes 251*b*, 253*b*, and 255*b* and travel toward the first to third lower electrodes 251*a*, 253*a*, and 255*a*. The light from the intermediate layer 270*a*, that travels in the direction of the first to third lower electrodes 251*a*, 253*a*, and 255*a*, may be reflected by the first to third lower electrodes 251*a*, 253*a*, and 255*a* and travel in the direction of the cathode 280*a*, and a part of the light may be reflected again and travel in the direction of the first to third lower electrodes 251*a*, 253*a*, and 255*a*. In this way, the micro-cavity effect in which light is amplified as reflection and re-reflection are repeated between the first to third lower electrodes 251*a*, 253*a*, and 255*a*, and the cathode 280*a* may occur. The light from the intermediate layer 270*a* amplified through the micro-cavity effect may improve luminous efficacy of the light emitting display device.

As described above, the first to third electrode patterns 251*c*, 253*c*, and 255*c* formed as the same layers as the first to third lower electrodes 251*a*, 253*a*, and 255*a* may be provided in the non-emission areas NEA. The first to third electrode patterns 251*c*, 253*c*, and 255*c* may overlap each other while being spaced apart from the first to third lower electrodes 251*a*, 253*a*, and 255*a*, respectively. Further, an area provided with the first to third electrode patterns 251*c*, 253*c*, and 255*c* is defined as the step area HA. A second vertical distance d2 from the upper surface of the transistor array 20 to the upper surface of the third electrode pattern 255*c* in contact with the first dummy pattern 270*b* at the step area HA may be greater than a first vertical distance d1 from the upper surface of the transistor array 20 to the upper surface of each of the anodes 251, 253, and 255 in contact with the intermediate layer 270*a* at the emission area EA. Further, since a vertical distance from the upper surface of the substrate 10 to the upper surface of the transistor array 20 at the emission area EA and the step area HA, a vertical distance from the upper surface of the substrate where the third electrode pattern 255*c* is in contact with the first dummy pattern 270*b* to an upper surface of the third electrode pattern 255*c* may be greater than a vertical distance from the upper surface of the substrate to each of the upper surfaces of the anodes 251, 253, 253 at the emission areas.

The step areas HA may be defined within the non-emission areas NEA between adjacent subpixels SP1, SP2, and SP3, and may be spaced apart from adjacent emission areas EA.

The trenches T may be provided between the step area HA and the emission areas EA adjacent thereto. In addition, the trench T may be formed around the emission area EA of each of the subpixels SP1, SP2, and SP3. A third vertical distance d3 from the upper surface of the transistor array 20 to a portion of the surface of the second insulating layer 240 located closest to the transistor array 20 may be smaller than the first vertical distance d1. Such a trench T may cut off a portion of the intermediate layer 270*a* at the edge of the emission area EA of each of the plurality of subpixels SP1, SP2, and SP3.

The trenches T between the step area HA and the adjacent emission areas EA may overlap at least the edge of the step area HA. The undercut UC may be provided under the third electrode pattern 255*c* in the trench T overlapping the step area HA. The undercut UC having a step on the side of a structure may completely separate components deposited on the structure. Therefore, the light emitting display device according to the present disclosure may completely separate the materials for the intermediate layer 270*a* in the emission areas EA from the first dummy pattern 270*b* in the step area HA through the undercut UC provided at the edge of the step area HA.

If the trenches T do not include the undercut UC, the materials for the intermediate layer 270*a* include a significant amount of organic materials, and thus, voids may occur between the organic materials of the adjacent subpixels SP1, SP2, and SP3, and the voids may collapse as the intermediate layer 270*a* and the first dummy pattern 270*b* become thicker. When the voids collapse, the intermediate layer 270*a* and the first dummy pattern 270*b* are not formed to have a constant thickness in the respective subpixels SP1, SP2, and SP3, and the organic materials move toward the trenches T, thereby causing a difference in the density of the intermediate layer 270*a* among the respective subpixels SP1, SP2, and SP3, thereby resulting in different luminescent properties and causing uneven light emission that may be recognized as stains. However, in the present disclosure, the undercut UC is provided in the trenches T, and thereby, the first dummy pattern 270*b* on the third electrode pattern 255*c* may be completely separated from the intermediate layer 270*a* in the emission areas EA, occurrence of voids may be prevented.

Further, among the first to third electrode patterns 251*c*, 253*c*, and 255*c*, the third electrode pattern 255*c* in contact with the first dummy pattern 270*b* may be provided to have a wider width than the first and second electrode patterns 251*c* and 253*c*. Accordingly, it may be advantageous to easily form the undercut UC between the second electrode pattern 253*c* and the second insulating layer 240 under the third electrode pattern 255*c*.

The materials for the intermediate layer 270*a* may be provided on the anodes 251, 253, and 255 and the bank 260 over the entire area of the substrate 10 through common masks. The light emitting display device according to the present disclosure has the undercut UC in the step areas HA of the non-emission areas NEA, so that the materials for the intermediate layer 270*a* may be separated into the intermediate layer 270*a* overlapping the emission areas EA, the first dummy pattern 270*b* overlapping the step areas HA, and the third dummy pattern 201 overlapping areas between the emission areas EA and the step areas HA. At least the intermediate layer 270*a* and the first dummy pattern 270*b* may be formed as the same layer. Specifically, the intermediate layer 270*a* and the first dummy patterns 270*b* may include a light emitting unit with a tandem structure including a first stack 271*a* or 271*b* and a second stack 275*a* or 275*b* having first and second emission layers EML1 and EML2, respectively, and a charge generation layer (CGL) 273*a* or 273*b* provided between the first stack 271*a* or 271*b* and the second stack 275*a* or 275*b*. The tandem structure is not limited to the above-described two-stack structure, and may include a plurality of stacks, such as three or more stacks. In some cases, the intermediate layer 270*a* and the first dummy patterns 270*b* may be formed of a single stack of organic layers including multiple layers including a hole injection layer (HIL), a hole transport layer (HTL), the emission layers EML1 or EML2, an electron transport layer (ETL), and an electron injection layer (EIL).

Here, the first and second emission layers EML1 and EML2 in the plurality of stacks may be emission layers which emits light of the same color, i.e., any one of red, green, and blue light, and may be provided in each of some of the plurality of subpixels SP1, SP2, and SP3. The multiple layers of the intermediate layer 270*a* excluding the first and the second emission layers EML1 and EML2 may be provided over the entire surface of the substrate 10 through common masks. Alternatively, when emitting white light through the first and second emission layers EML1 and EML2 in the two-stack structure or emission layers in a multiple stack structure including three or more stacks, each of the emission layers may be provided over the entire surface of the substrate 10 through a common mask in the same manner as the other layers of the intermediate layer 270*a*.

The charge generation layers 273*a* and 273*b* may be formed in a double-layer structure including an n-type charge generation layer and a p-type charge generation layer. The n-type charge generation layer and the p-type charge generation layers of the charge generation layers 273*a* and 273*b* may include an n-type dopant and a p-type dopant, respectively. For example, the n-type dopant may include a metal dopant such as lithium (Li) or ytterbium (Yb), and this metal dopant may cause increase in charge mobility and thus cause leakage current between adjacent subpixels when the n-type charge generation layer is formed in common in the plurality of subpixels SP1, SP2, and SP3. In addition to the n-type charge generation layer, layers of the intermediate layer 270*a* including materials having high charge mobility may cause leakage current.

However, the layers of the intermediate layer 270*a* of the present disclosure are not continuously deposited between adjacent subpixels SP1, SP2, and SP3, and may be separated into the intermediate layer 270 and the first dummy pattern 270*b* in the emission areas EA and the step areas HA, respectively, by the trenches T including the undercut UC in the step areas HA.

Particularly, in the light emitting display device according to the present disclosure, a height from the substrate 10 to the upper electrodes 251*b*, 253*b*, and 255*b* in the emission areas and a height from the substrate to the third electrode pattern 255*c* in the step areas HA may be different from each other. Therefore, even if the upper part of the side surface of the intermediate layer 270*a* and the upper part of the side surface of the first dummy pattern 270*b* come into contact with each other, different layers of the intermediate layer 270*a* and the first dummy pattern 270*b* may come into contact with each other because the emission areas EA and the step areas HA have different heights. Accordingly, the light emitting display device according to the present disclosure may completely prevent leakage current from flowing through common layers between adjacent subpixels SP1, SP2, and SP3.

Meanwhile, the sealing layer 290 may be provided on the cathode 280*a* and the second dummy pattern 280*b*. The sealing layer 290 may be provided to cover all of the active area and a non-active area. The sealing layer 290 prevents oxygen and moisture from penetrating into the light emitting elements, thereby improving the lifespan of the light emitting display device. For example, the sealing layer 290 may be formed by stacking one or more pairs of an inorganic encapsulation film and an organic encapsulation film, or may be formed by stacking a filler material and a counter substrate on the substrate 10.

The bank 260 may be provided on the second insulating layer 240 to cover the edge of each of the first to third upper electrodes 251*b*, 253*b*, and 255*b*. The bank 260 may prevent decrease in luminous efficacy caused by concentration of current on the edges of the ends of the first to third upper electrodes 251*b*, 253*b*, and 255*b*. The bank 260 may be formed of a thin inorganic insulating film, and may be locally provided at the edge of each of the first to third upper electrodes 251*b*, 253*b*, and 255*b*. However, the present disclosure is not limited thereto, and may be formed of an organic insulating film which is thicker than the inorganic insulating film.

Figure 4:
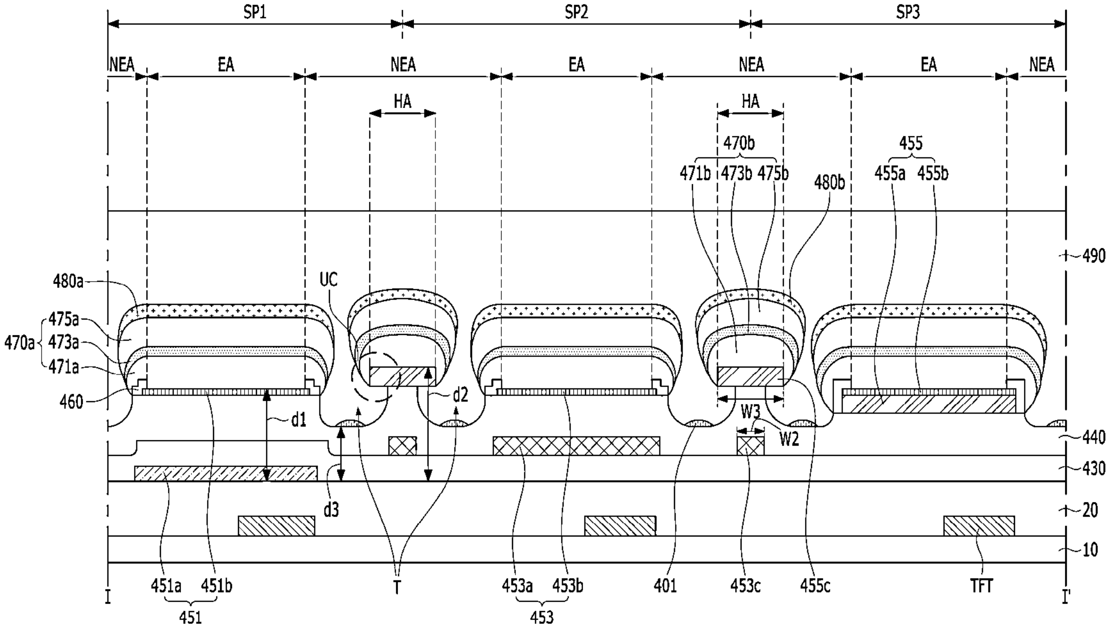
FIG. 4 is a cross-sectional view showing a modification of FIG. 2.

FIG. 4 is a cross-sectional view showing a modification of FIG. 2. Hereinafter, a description of the same configuration as the configuration of the previous embodiment will be omitted.

With reference to FIG. 4, compared to the embodiment shown in FIG. 2, only two layers of electrode patterns 453*c* and 455*c* may be provided in the non-emission areas NEA. The second and third electrode patterns 453*c* and 455*c* may be formed as the same layers as a second lower electrode 453*a* and a third lower electrode 455*a*, respectively. The second and third electrode patterns 453*c* and 455*c* may be formed in the same processes as the second and third lower electrodes 455*a*, respectively. The second and third electrode patterns 453*c* and 455*c* may have the same thickness as the second and third lower electrodes 453*a* and 455*a* having a greater thickness than upper electrodes 451*b*, 453*b*, and 455*b* so as to have a high reflectance. That is, even if only the two layers of the second and third electrode patterns 453*c* and 455*c* are stacked in the non-emission areas NEA, the emission areas EA and the step areas HA may have different vertical distances from the substrate 10.

Specifically, a second vertical distance d2 from the upper surface of the transistor array 20 to the upper surface of the third electrode pattern 455*c* in contact with a first dummy pattern 470*b* in the step area HA may be greater than a first vertical distance d1 from the upper surface of the transistor array 20 to the upper surface of each of anodes 451, 453, and 455 in contact with an intermediate layer 470*a* in the emission area EA. Accordingly, in the light emitting display device of the present disclosure according to the embodiment shown in FIG. 4, the same component in layers forming the intermediate layer 470*a* and layers forming the first dummy pattern 470*b* may be located at different heights due to only a difference between the first vertical distance d1 and the second vertical distance d2 in the emission areas EA and the non-emission areas NEA. Therefore, the light emitting display device may have the effect of preventing leakage current from flowing between adjacent subpixels SP1, SP2, and SP3.

Trenches T may be provided between the step area HA and the emission areas EA adjacent thereto. In addition, the trench T may be formed around the emission area EA of each of the subpixels SP1, SP2, and SP3. A third vertical distance d3 from the upper surface of the transistor array 20 to a portion of the surface of the second insulating layer 240 located closest to the transistor array 20 may be smaller than the first vertical distance d1.

Figure 5A:
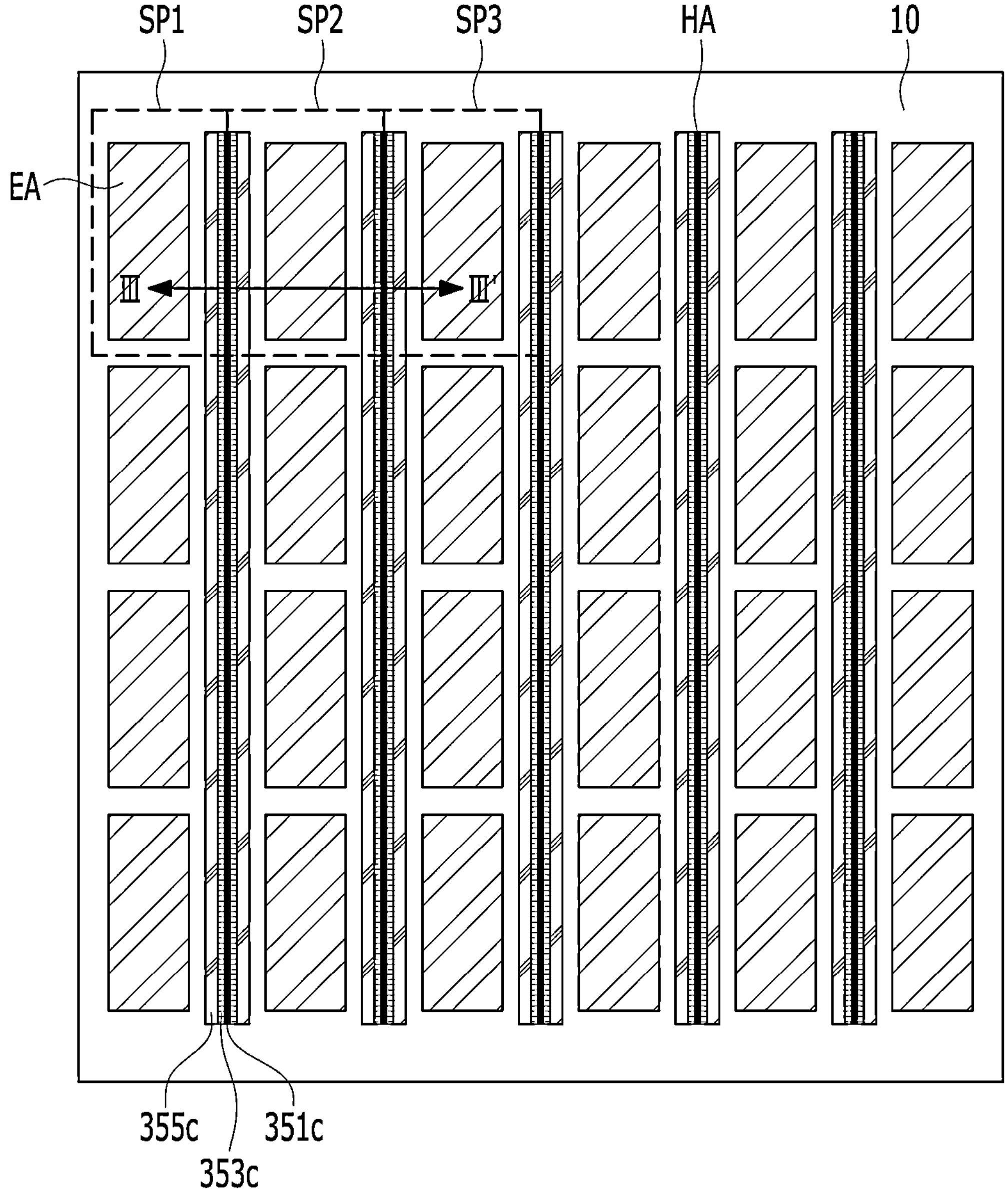
FIG. 5A is a plan view of a light emitting display device according to a second embodiment of the present disclosure.
Figure 5B:
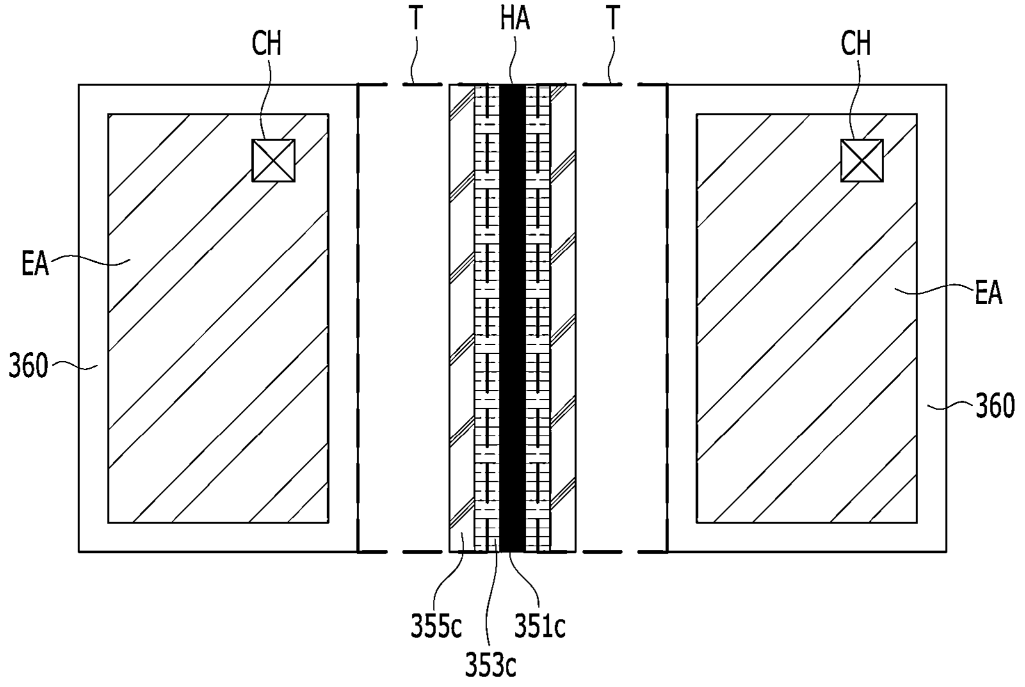
FIG. 5B is an enlarged plan view of a portion of FIG. 5A.
Figure 6:
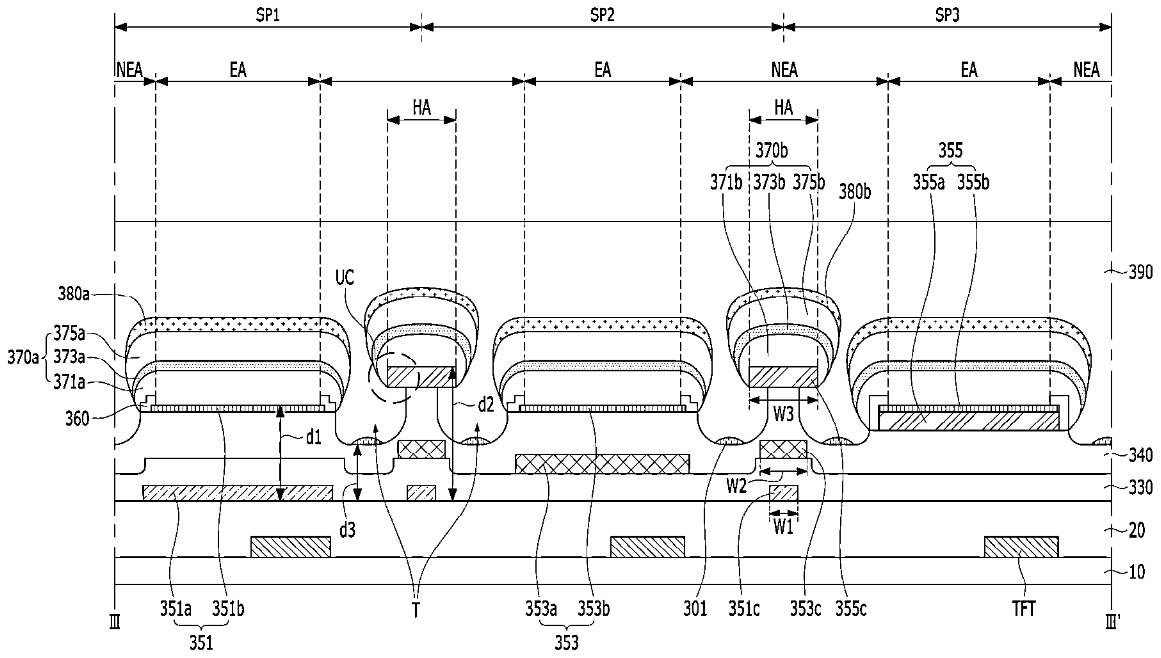
FIG. 6 is a cross-sectional view taken along line III-III' of FIG. 5A.

FIG. 5A is a plan view of a light emitting display device according to a second embodiment of the present disclosure, and FIG. 5B is an enlarged plan view of a portion of FIG. 5A. FIG. 6 is a cross-sectional view taken along line III-III' of FIG. 5A.

With reference to FIG. 5A to 6, in the light emitting display device according to the second embodiment, first to third electrode patterns 351*c*, 353*c*, and 355*c* may have different widths. Specifically, a third width W3 of the third electrode pattern 355*c* in contact with a first dummy pattern 370*b* formed as the same layer as an intermediate layer 370*a* may be greater than first and second widths W1 and W2 of the first and second electrode patterns 351*c* and 353*c*. In addition, the second width W2 of the second electrode pattern 353*c* may be greater than the first width W1 of the first electrode pattern 351*c* . . . . As such, the first to third electrode patterns 351*c*, 353*c*, and 355*c* may have narrower widths as they become closer to the transistor array 20 or the substrate 10. Further, in the same manner as the first embodiment, the first to third electrode patterns 351*c*, 353*c*, and 355*c* may overlap each other, while being spaced apart from first to third lower electrodes 351*a*, 353*a*, and 355*a*, respectively.

In the same manner as the modification of the first embodiment, among the first to third electrode patterns 351*c*, 353*c*, and 355*c*, only one of the first electrode pattern 351*c* and the second electrode pattern 353*c* may be provided.

Figure 7A:
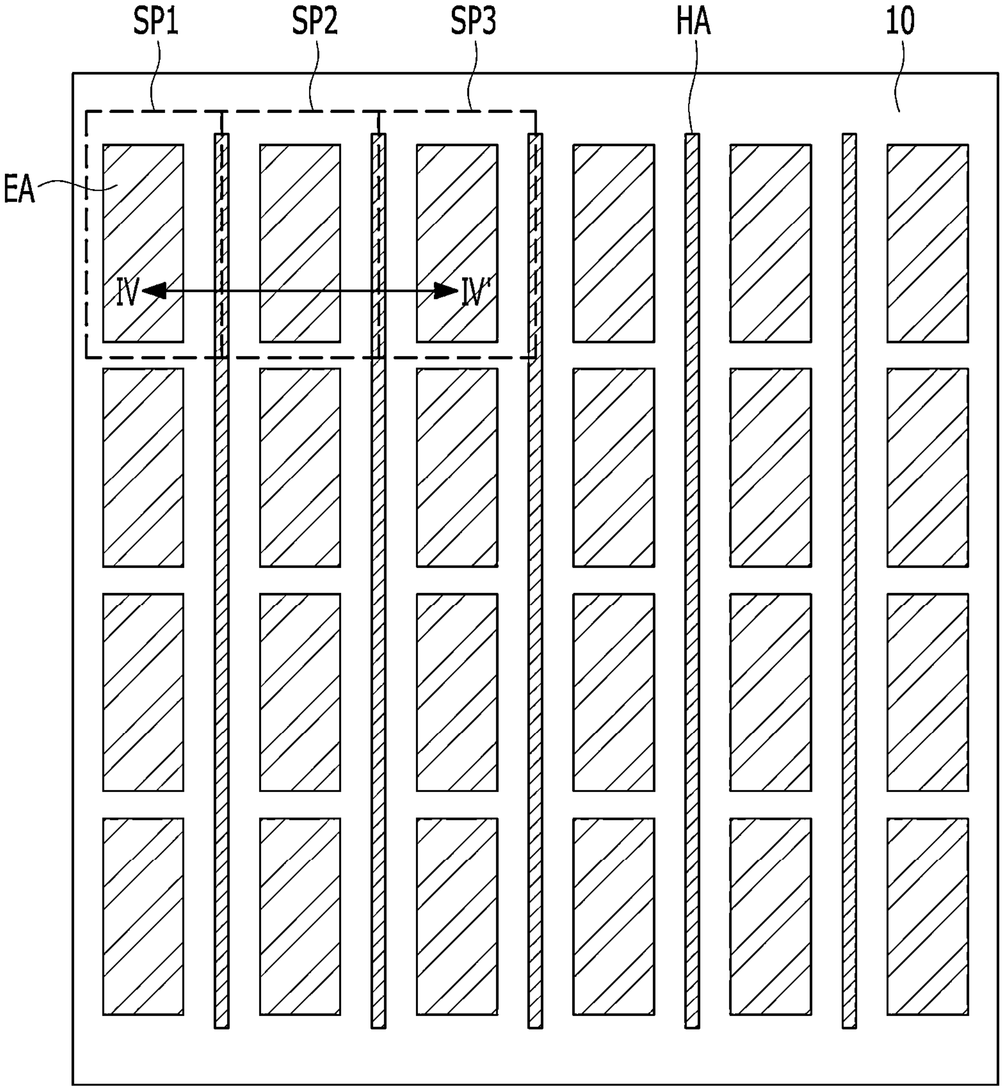
FIG. 7A is a plan view of a light emitting display device according to a third embodiment of the present disclosure.
Figure 7B:
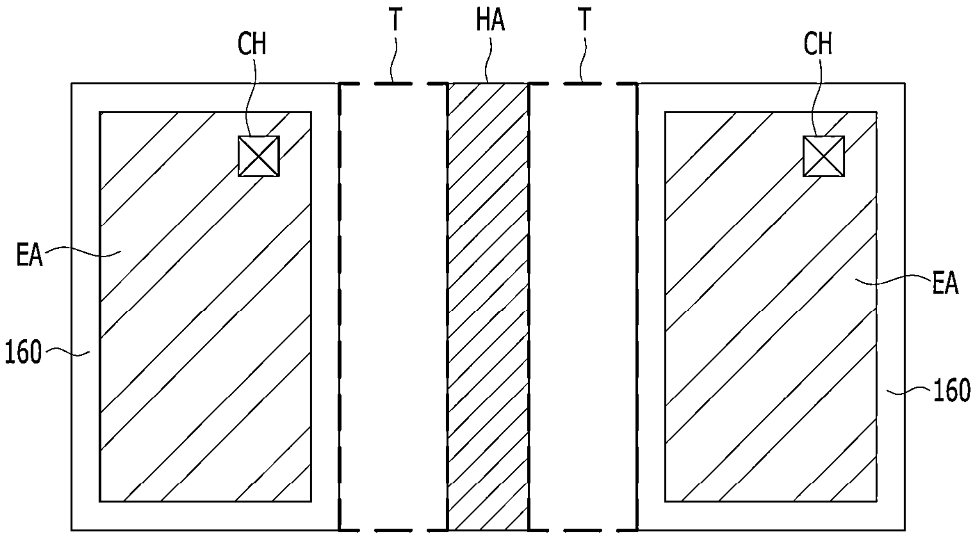
FIG. 7B is an enlarged plan view of a portion of FIG. 7A.
Figure 8:
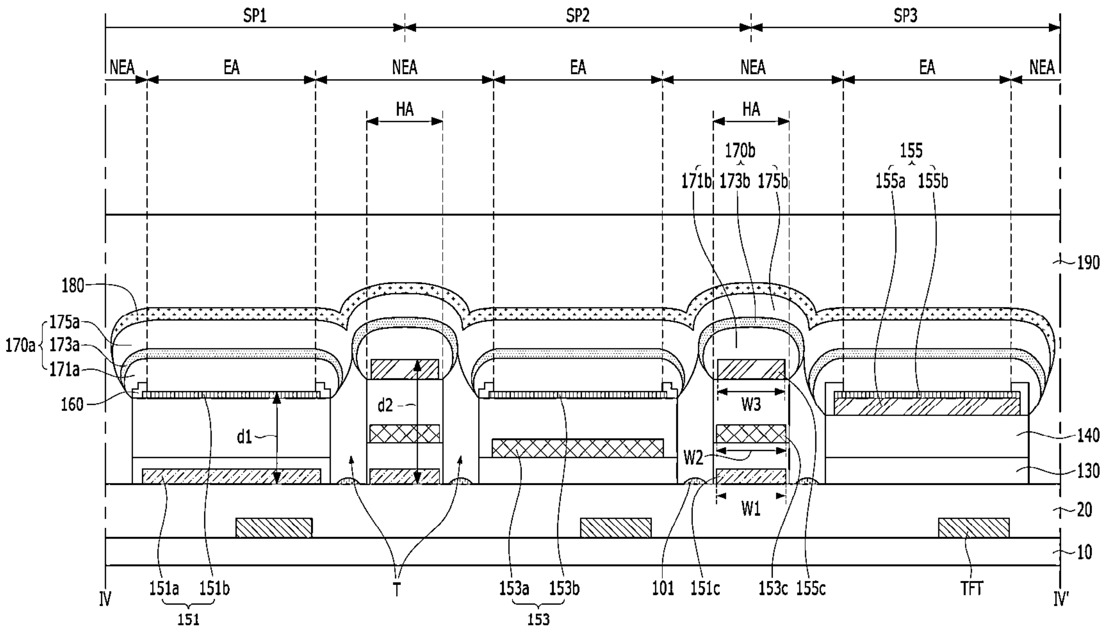
FIG. 8 is a cross-sectional view taken along line IV-IV' of FIG. 7A.

FIG. 7A is a plan view of a light emitting display device according to a third embodiment of the present disclosure, and FIG. 7B is an enlarged plan view of a portion of FIG. 7A. FIG. 8 is a cross-sectional view taken along line IV-IV' of FIG. 7A.

With reference to FIGS. 7A to 8, in the light emitting display device according to the third embodiment, first to third widths W1, W2, and W3 of first to third electrode patterns 151*c*, 153*c*, and 155*c* may be the same. Further, in the same manner as the first embodiment, the first to third electrode patterns 151*c*, 153*c*, and 155*c* may overlap each other, while being spaced apart from first to third lower electrodes 151*a*, 153*a*, and 155*a*, respectively.

In the light emitting display device according to the third embodiment, the trenches T do not include an undercut. That is, the light emitting display device according to the third embodiment may not have an undercut UC under the third electrode patterns 155*c* compared to the first and second embodiments. Compared to the previous embodiments, in the light emitting display device according to the third embodiment, the trenches T may be configured such that both a first insulating layer 130 and a second insulating layer 140 are removed, and the surface of the transistor array 20 is exposed to areas which do not overlap the step areas HA of the non-emission areas NEA.

Accordingly, in the light emitting display device according to the third embodiment, some parts of a first dummy pattern 170*b* on the third electrode pattern 155*c* and an intermediate layer 170*a* on each of first to third anodes 151, 153, and 155 may come into contact with each other, and some other parts may be separated from each other. By providing the trenches T, a material for a first stack 171*a* of the intermediate layer 170*a* may be separated into the first stack 171*a* in the emission areas EA, a first layer 170*b* in the step areas HA, and a third dummy pattern 101 in the non-emission areas NEA which do not overlap the step areas HA. As the intermediate layer 170*a* becomes thicker, voids between the intermediate layer 170*a* and the first dummy pattern 170*b* collapse, and thus, a charge generation layer 173*a* of the intermediate layer 170*a* and a second layer 173*b* of the first dummy pattern 170*b* may be close to the non-emission area NEA between the step area HA and the emission area EA. However, in the light emitting display device of the present disclosure, because a second vertical distance d2 from the upper surface of the transistor array 20 to the upper surface of the third electrode pattern 155*c* in the step area HA is greater than a first vertical distance d1 from the upper surface of the transistor array 20 to the upper surface of each of first to third upper electrodes 151*b*, 153*b*, and 155*b*, the charge generation layer 173*a* of the intermediate layer 170*a* and the second layer 173*b* of the first dummy pattern 170*b* may not be in contact with each other. Although a second stack 175*a* of the intermediate layer 170*a* and a third layer 175*b* of the first dummy pattern 170*b* may be in contact with each other, the layers in contact with each other may be layers having different configurations due to a step between the emission area EA and the step area HA. Therefore, in the light emitting display device according to the present disclosure, because one layer having a higher charge mobility than other layers is located at different heights in the emission area EA and the step area HA due to the step therebetween, even if there is a region in which the intermediate layer 170*a* and the first dummy pattern 170*b* come into contact with each other, the intermediate layer 170*a* and the first dummy pattern 170*b* come into contact with such that a common layer is discontinuous, and thus, leakage current through the common layer between adjacent subpixels may be completely prevented.

If the second stack 175*a* of the intermediate layer 170*a* and the third layer 175*b* of the first dummy pattern 170*b* come into contact with each other, a cathode 180 on the intermediate layer 170*a* may be continuously provided throughout the substrate 10.

FIGS. 9A to 9H are cross-sectional views showing a process of manufacturing the light emitting display device shown in FIG. 2.

Figure 9A:
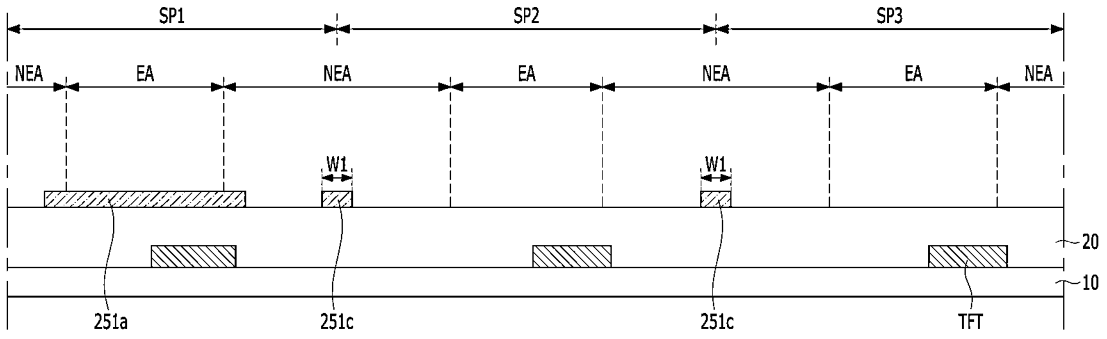
FIGS. 9A to 9H are cross-sectional views showing a process of manufacturing the light emitting display device shown in FIG. 2.

With reference to FIG. 9A, the transistor TFT may be formed in each of the plurality of subpixels SP1, SP2, and SP3. The transistor array 20 including a plurality of insulating layers plurality of transistors TFT and an insulating film, which flattens steps of the plurality of transistors TFTs, on the plurality of transistors TFT may be formed. Thereafter, the first lower electrode 251*a* which overlaps the emission area EA of the first subpixel SP1, and the first electrode patterns 251*c* which are spaced apart from the first lower electrode 251*a* to correspond to the non-emission areas NEA of adjacent subpixels SP1, SP2, and SP3 may be formed on the transistor array 20 through a mask process.

Figure 9B:
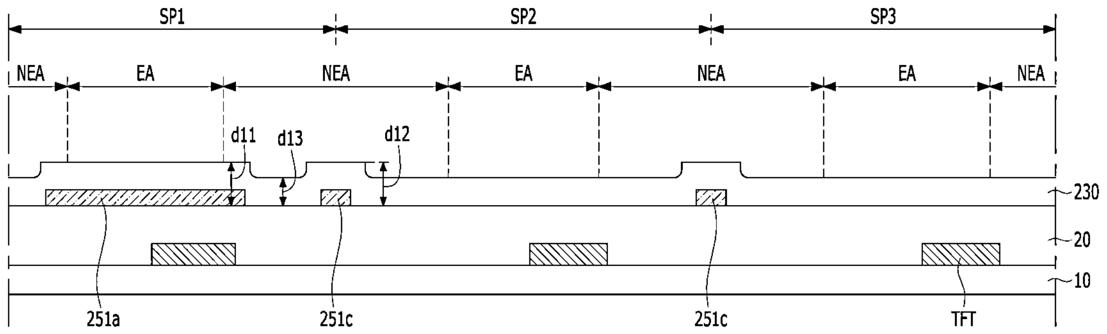

Next, with reference to FIG. 9B, the first insulating layer 230 may be formed on the transistor array 20 provided with the first lower electrode 251*a* and the first electrode patterns 251*c* formed thereon over the entire area of the substrate 10. The first insulating layer 230 may be formed of an inorganic insulating material so that steps due to the first lower electrode 251*a* and the first electrode patterns 251*c* on the transistor array 20 may be maintained. Accordingly, a vertical distance d11 from the upper surface of the transistor array 20 to the upper surface of the first insulating film 230 in the emission area EA may be the same as a vertical distance d12 from the upper surface of the transistor array 20 to the upper surface of the first insulating film 230 in an area which overlaps the first electrode pattern 251*c*, and may be greater than a vertical distance d13 from the upper surface of the transistor array 20 to the upper surface of the first insulating film 230 in an area which does not overlap the first lower electrode 251*a* and the first electrode patterns 251*c*.

Figure 9C:
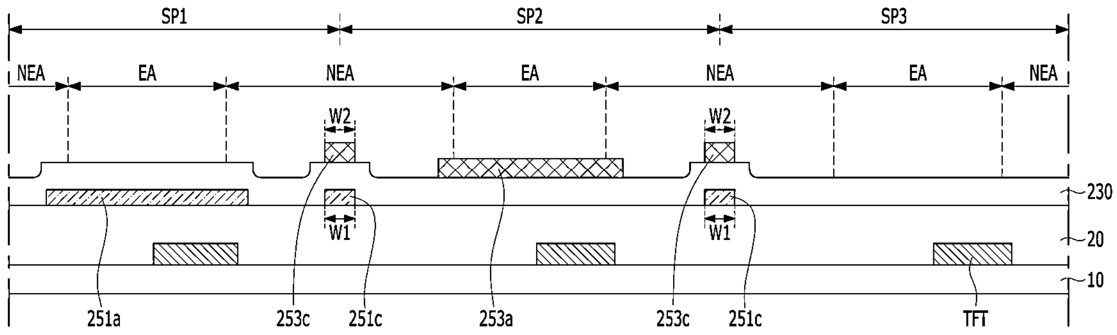

Thereafter, with reference to FIG. 9C, the second lower electrode 253*a* which overlaps the emission area EA of the second subpixel SP2, and the second electrode patterns 253*c* which are spaced apart from the second lower electrode 253*a* to correspond to the non-emission areas NEA may be formed on the first insulating film 230 through a mask process. Here, the second electrode patterns 253*c* may overlap the first electrode patterns 251*c*, and the second width W2 of the second electrode patterns 253*c* may be the same as the first width W1 of the first electrode patterns 251*c*.

Figure 9D:
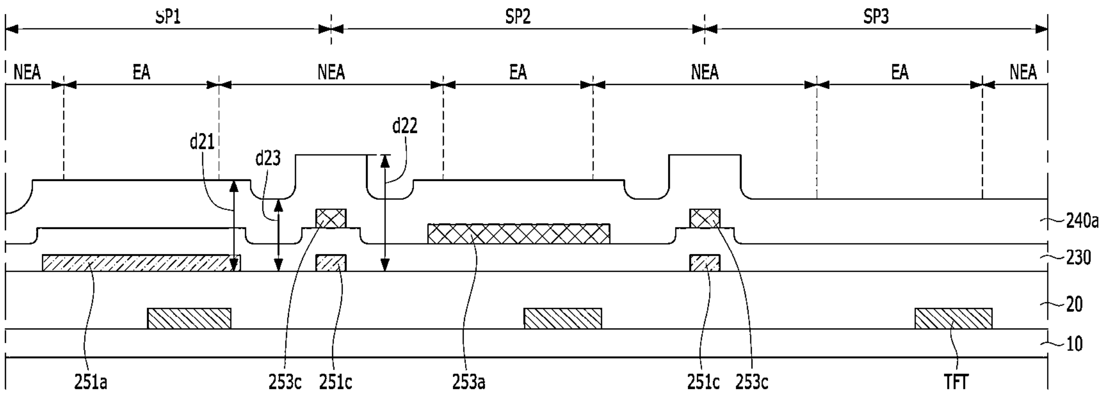

Thereafter, with reference to FIG. 9D, a second insulating material 240*a* is provided on the first insulating layer 230 provided with the second lower electrode 253*a* and the second electrode patterns 253*c* formed thereon over the entire area of the substrate 10. The second insulating material 240*a* may be formed of an inorganic material so that steps due to the second lower electrode 253*a* and the second electrode patterns 253*c* on the first insulating layer 230 may be maintained. Accordingly, a vertical distance d21 from the upper surface of the transistor array 20 to the upper surface of the second insulating material 240*a* in the emission area EA may be smaller than a vertical distance d22 from the upper surface of the transistor array 20 to the upper surface of the second insulating material 240*a* in the area which overlaps the first electrode pattern 251*c*, and may be greater than a vertical distance d23 from the upper surface of the transistor array 20 to the upper surface of the second insulating material 240*a* in the area which does not overlap the first lower electrode 251*a* and the first electrode patterns 251*c*.

Figure 9E:
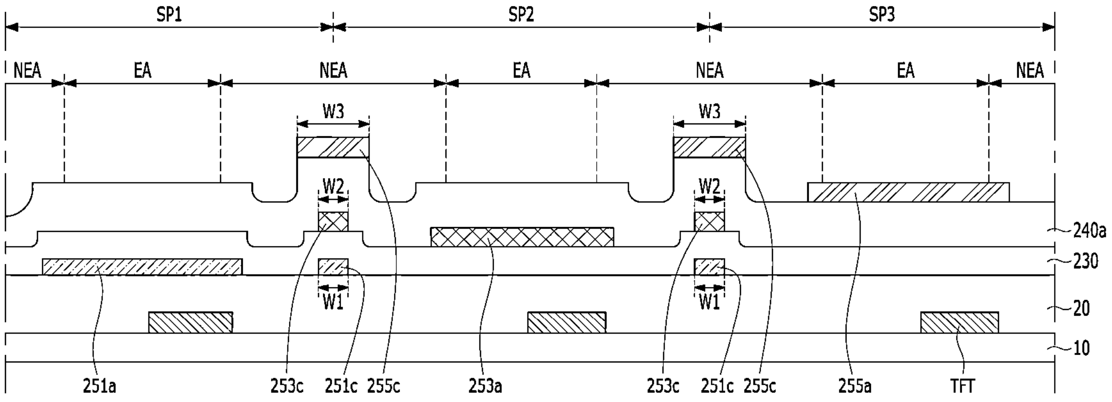

Thereafter, with reference to FIG. 9E, the third lower electrode 255*a* which overlaps the emission area EA of the third subpixel SP3, and the third electrode patterns 255*c* which are spaced apart from the third lower electrode 255*a* to correspond to the non-emission areas NEA may be formed on the second insulating material 240*a* through a mask process. Here, the third electrode patterns 255*c* may overlap the first electrode patterns 251*c* and the second electrode patterns 253*c*, and the third width W3 of the third electrode patterns 255*c* may be greater than the first width W1 and the second width W2 of the first electrode patterns 251*c* and the second electrode patterns 253*c*, respectively. Further, an area in the non-emission area NEA in which the third electrode pattern 255*c* is formed may be defined as the step area HA.

Figure 9F:
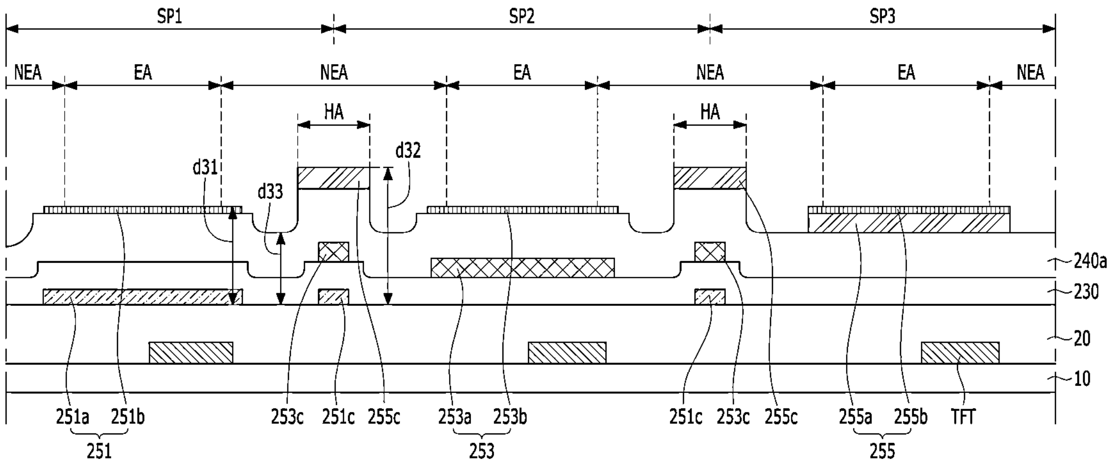

Thereafter, with reference to FIG. 9F, the first upper electrode 251*b* which overlaps the first lower electrode 251*a* of the first subpixel SP1, the second upper electrode 253*b* which overlaps the second lower electrode 253*a* of the second subpixel SP2, and the third upper electrode 255*b* which overlaps the third lower electrode 255*a* of the third subpixel SP3 may be formed on the second insulating material 240*a*. Here, a vertical distance d31 from the upper surface of the transistor array 20 to the upper surfaces of the upper electrodes 251*b*, 253*b*, and 255*b* in the emission area EA may be smaller than a vertical distance d32 from the upper surface of the transistor array 20 to the upper surface of the third electrode pattern 255*c* in the step area HA, and may be greater than a vertical distance d33 from the upper surface of the transistor array 20 to the upper surface of the second insulating material 240*a* in the area which does not overlap the first lower electrode 251*a* and the first electrode patterns 251*c*.

Figure 9G:
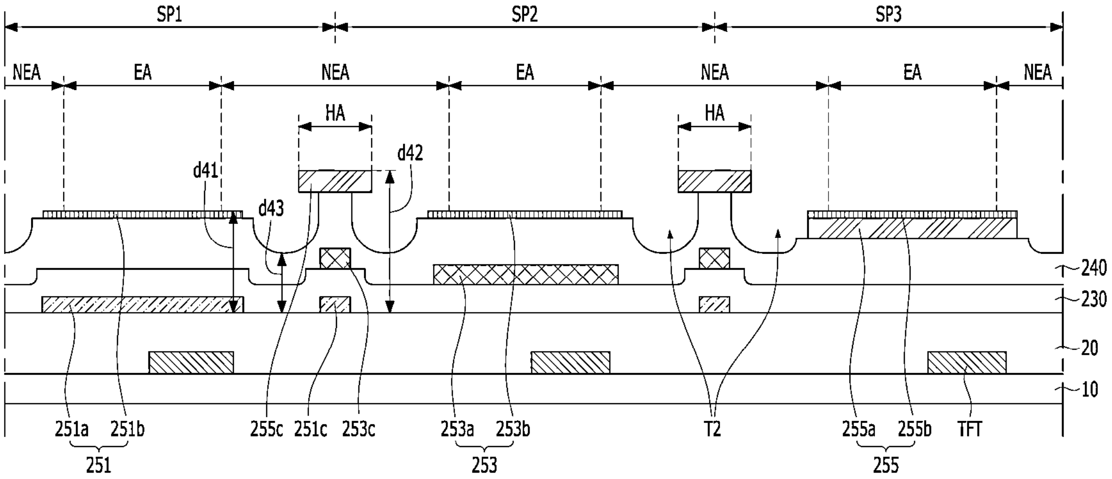

Thereafter, with reference to FIG. 9G, the second insulating layer 240 having an undercut UC under the third electrode patterns 255*c* may be formed by over-etching the second insulating material 240*a* in contact with the third electrode patterns 255*c*. Thereby, a vertical distance d43 from the upper surface of the transistor array 20 to the upper surface of the second insulating layer 240 in the area which does not overlap the first lower electrode 251*a* and the first electrode patterns 251*c* may be shorter than the vertical distance d33 shown in FIG. 9F. That is, the trenches T (in FIG. 9H) may become deeper through the over-etching process.

Figure 9H:
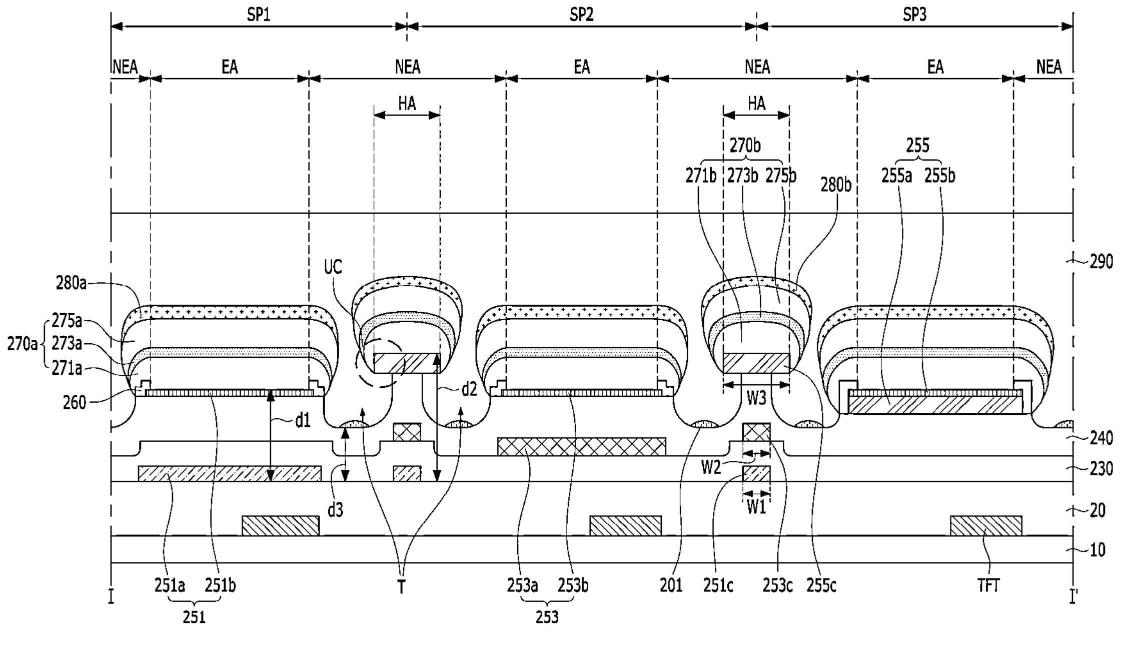

Thereafter, with reference to FIG. 9H, the materials for the intermediate layer 270*a* and the material for the cathode 280*a* may be sequentially provided on the second insulating layer 240 provided with the upper electrodes 251*b*, 253*b*, and 255*b* and the third electrode patterns 255*c*. At this time, the materials for the intermediate layer 270*a* may be completely separated into the intermediate layer 270*a* and the first dummy patterns 270*b* in the emission areas EA and the step areas HA, respectively, due to a height difference from the transistor array 20 between the emission areas EA and the step areas HA, and the undercut UC. Likewise, the material for the cathode 280*a* may be completely separated into the cathode 280*a* and the second dummy patterns 280*b* in the emission areas EA and the step areas HA, respectively.

In the above embodiments, the lower electrodes at the first subpixel SP1 and the third subpixel SP3 can be disposed at positions inverted from each other. That is, at the first sub-pixel SP1, the lower electrode and the upper electrode are in contact with each other, and at the third sub-pixel SP3, there are first and second insulating layer between the lower electrode and the upper electrode. A vertical distance between the lower electrode and the upper electrode at the third sub-pixel SP3 is the maximum among the first to third sub-pixels.

A light emitting display device according to one embodiment of the present disclosure may comprise a substrate comprising a first subpixel and a second subpixel to have an emission area and a non-emission area, respectively, a first insulating layer on the substrate, a first anode comprising a first lower electrode and a first upper electrode over the first insulating layer at the first subpixel, a second anode comprising a second lower electrode and a second upper electrode spaced from each other by the first insulating layer interposed therebetween at the second subpixel, a first electrode pattern provided at the non-emission areas, spaced from the first lower electrode, and comprising a same layer as the first lower electrode and a second electrode pattern spaced from the second lower electrode, overlapping the first electrode pattern, and comprising a same layer as the second lower electrode. A first vertical distance from an upper surface of the substrate where the first electrode pattern and the second electrode pattern overlap each other to an upper surface of the first electrode pattern may be greater than a second vertical distance from the upper surface of the substrate to an upper surface of the first upper electrode at the emission area.

In a light emitting display device according to one embodiment of the present disclosure, the second electrode pattern may have a smaller width than the first electrode pattern.

A light emitting display device according to one embodiment of the present disclosure may further comprise a third subpixel spaced from each of the first and second subpixels on the substrate, a second insulating layer between the substrate and the first insulating layer, a third anode at the third subpixel, the t comprising a third lower electrode and a third upper electrode spaced from each other by the first insulating layer and the second insulating layer interposed therebetween and a third electrode pattern spaced from the third lower electrode, to overlap the first electrode pattern and the second electrode pattern, comprising a same layer as the third lower electrode.

In a light emitting display device according to one embodiment of the present disclosure, the third electrode pattern may have a smaller width than the first electrode pattern.

In a light emitting display device according to one embodiment of the present disclosure, the second electrode pattern may have a smaller width than the first electrode pattern and the third electrode pattern has a smaller width than the second electrode pattern.

In a light emitting display device according to one embodiment of the present disclosure, a width of the first insulating layer at a region in contact with the first electrode pattern may be smaller than the first electrode pattern.

A light emitting display device according to one embodiment of the present disclosure may further comprise an intermediate layer and a cathode on each of the first to third anodes, a first dummy pattern on the first electrode pattern, as a same layer as the intermediate layer and a second dummy pattern on the first dummy pattern, as a same layer as the cathode. The intermediate layer and the first dummy pattern may be separated from each other.

A light emitting display device according to one embodiment of the present disclosure may further comprise an intermediate layer and a cathode sequentially provided on the first anode, the second anode, and the second electrode pattern. The intermediate layer may comprise a plurality of layers comprising at least one layer having a higher charge mobility than other layers and the at least one layer of the plurality of layers of the intermediate layer may have a discontinuous area in the non-emission areas.

In a light emitting display device according to one embodiment of the present disclosure, a third vertical distance from the upper surface of the substrate to an uppermost surface of the first insulating layer at an area in the non-emission area which do not overlap the third electrode pattern may be smaller than the second vertical distance.

In a light emitting display device according to one embodiment of the present disclosure, the first insulating layer may comprise an inorganic insulating material.

In a light emitting display device according to one embodiment of the present disclosure, the first lower electrode may have a higher reflectance than the first upper electrode and the second lower electrode has a higher reflectance than a the second upper electrode.

In a light emitting display device according to one embodiment of the present disclosure, each of the first and second lower electrodes may have a greater thickness than a corresponding one of the first and second upper electrodes.

A light emitting display device according to one embodiment of the present disclosure may comprise a substrate comprising first to third subpixels, first to third lower electrodes on the substrate, to overlap emission areas of the first to third subpixels, respectively, a first insulating layer over the substrate, a first electrode pattern above a first insulating layer, to overlap a non-emission area between the respective emission areas of the first to third subpixels, a second insulating layer between the first insulating layer and the substrate, a second electrode pattern to overlap the first electrode pattern, the second electrode pattern between the first insulating layer and the second insulating layer, the second electrode pattern spaced from the second lower electrode and a third electrode pattern to overlap the first electrode pattern and the second electrode pattern between the second insulating layer and the substrate, the third pattern spaced from the third lower electrode. The first insulating layer may have a trench configured to partially overlap an edge of the first electrode pattern.

In a light emitting display device according to one embodiment of the present disclosure, the second electrode pattern may have a smaller width than the first electrode pattern.

In a light emitting display device according to one embodiment of the present disclosure, the third electrode pattern may have a smaller width than the second electrode pattern.

In a light emitting display device according to one embodiment of the present disclosure, the first insulating layer may comprise an inorganic insulating material.

A light emitting display device according to one embodiment of the present disclosure may further comprise first to third upper electrodes located on the first to third lower electrodes, respectively. Each of the first to third upper electrodes may have a higher transmittance than a corresponding one of the first to third lower electrodes.

A light emitting display device according to one embodiment of the present disclosure may comprise a substrate having a plurality of emission areas and non-emission areas between the plurality of emission areas, a plurality of anodes at the plurality of emission areas, each anode comprising a lower electrode and an upper electrode, wherein such that the lower electrode is located at a different vertical positions from lower electrodes of adjacent emission areas, a first insulating layer on the lower electrode of at least one among the plurality of anodes and an electrode pattern on the first insulating layer at the non-emission between the plurality of emission areas, the electrode pattern horizontally spaced from the lower electrodes, respectively. A lower surface of the electrode pattern may have a higher vertical phase than a lower surface of the upper electrode at each of the plurality of emission areas.

In a light emitting display device according to one embodiment of the present disclosure, the electrode pattern may be provided as a same layer of the lower electrode of an anode at an emission area c to emit light of a shortest wavelength among the plurality of emission areas.

In a light emitting display device according to one embodiment of the present disclosure, an upper surface of the first insulating layer between the upper electrode and the electrode pattern may be lower than the lower surface of the upper electrode.

As is apparent from the above description, a light emitting display device according to the present disclosure has the following effects.

First, the light emitting display device according to the present disclosure has at least two layers of electrode patterns in the same layers as lower electrodes of adjacent subpixels in non-emission areas of the adjacent subpixels, and may thus prevent corresponding layers of an intermediate layer in an emission area and a first dummy pattern in the non-emission area from coming into contact with each other, thereby being capable of preventing leakage current from flowing through a common layer between the adjacent subpixels.

Second, the light emitting display device according to the present disclosure has an undercut in an insulating layer under an electrode pattern in contact with the first dummy pattern, and may thus completely separate the intermediate layer and the first dummy pattern from each other between adjacent subpixels, thereby being capable of preventing occurrence of voids between the intermediate layer and the first dummy pattern between the adjacent subpixels.

Third, the light emitting display device according to the present disclosure has electrode patterns formed as the same layers as the lower electrodes in the non-emission areas without adding a separate mask, and may thus not require a separate process even if electrode patterns for forming step areas are added.

Fourth, the light emitting display device according to the present disclosure has the electrode patterns formed as the same layers as the lower electrodes in the non-emission areas without any separate process, and may thus reduce energy required to manufacture the light emitting display device. Accordingly, the light emitting display device according to the present disclosure has environmental, social, and governance (ESG) effects in terms of environmental friendliness and process optimization.

It will be apparent to those skilled in the art that various modifications and variations can be made in the present disclosure without departing from the spirit or scope of the disclosure. Thus, it is intended that the present disclosure cover the modifications and variations of the present disclosure provided they come within the scope of the appended claims and their equivalents.

What is claimed is:

1. A light emitting display device comprising:

a substrate comprising a first subpixel and a second subpixel to have an emission area and a non-emission area, respectively;

a first insulating layer on the substrate;

a first anode comprising a first lower electrode and a first upper electrode over the first insulating layer at the first subpixel;

a second anode comprising a second lower electrode and a second upper electrode spaced from each other by the first insulating layer interposed therebetween at the second subpixel;

a first electrode pattern provided at the non-emission areas, spaced from the first lower electrode, and comprising a same layer as the first lower electrode; and a second electrode pattern spaced from the second lower electrode, overlapping first electrode pattern, and the comprising a same layer as the second lower electrode, wherein a first vertical distance from an upper surface of the substrate where the first electrode pattern and the second electrode pattern overlap each other to an upper surface of the first electrode pattern is greater than a second vertical distance from the upper surface of the substrate to an upper surface of the first upper electrode at the emission area.

2. The light emitting display device according to claim 1, wherein the second electrode pattern has a smaller width than the first electrode pattern.

3. The light emitting display device according to claim 1, further comprising:

a third subpixel spaced from each of the first and second subpixels on the substrate;

a second insulating layer between the substrate and the first insulating layer;

a third anode at the third subpixel, the third anode comprising a third lower electrode and a third upper electrode spaced from each other by the first insulating layer and the second insulating layer interposed therebetween; and a third electrode pattern spaced from the third lower electrode, to overlap the first electrode pattern and the second electrode pattern, comprising a same layer as the third lower electrode.

4. The light emitting display device according to claim 3, wherein the third electrode pattern has a smaller width than the first electrode pattern.

5. The light emitting display device according to claim 3, wherein:

the second electrode pattern has a smaller width than the first electrode pattern; and the third electrode pattern has a smaller width than the second electrode pattern.

6. The light emitting display device according to claim 3, further comprising:

an intermediate layer and a cathode on each of the first to third anodes;

a first dummy pattern on the first electrode pattern, as a same layer as the intermediate layer; and a second dummy pattern on the first dummy pattern, as a same layer as the cathode, wherein the intermediate layer and the first dummy pattern are separated from each other.

7. The light emitting display device according to claim 3, wherein a third vertical distance from the upper surface of the substrate to an uppermost surface of the first insulating layer at an area in the non-emission area which do not overlap the third electrode pattern is smaller than the second vertical distance.

8. The light emitting display device according to claim 1, wherein a width of the first insulating layer at a region in contact with the first electrode pattern is smaller than a width of the first electrode pattern.

9. The light emitting display device according to claim 1, further comprising:

an intermediate layer and a cathode sequentially provided on the first anode, the second anode, and the first electrode pattern, wherein:

the intermediate layer comprises a plurality of layers comprising at least one layer having a higher charge mobility than other layers; and the at least one layer of the plurality of layers of the intermediate layer has a discontinuous area in the non-emission areas.

10. The light emitting display device according to claim 1, wherein the first insulating layer comprises an inorganic insulating material.

11. The light emitting display device according to claim 1, wherein the first lower electrode has a higher reflectance than the first upper electrode and the second lower electrode has a higher reflectance than the second upper electrode.

12. The light emitting display device according to claim 1, wherein the first electrode has a greater thickness than the first upper electrode and the second lower electrode has a greater thickness than the second upper electrode.

13. A light emitting display device comprising:

a substrate comprising first to third subpixels;

first to third lower electrodes on the substrate, to overlap emission areas of the first to third subpixels, respectively;

a first insulating layer over the substrate;

a first electrode pattern above the first insulting layer, to overlap a non-emission area between the respective emission areas of the first to third subpixels;

a second insulating layer between the first insulating layer and the substrate;

a second electrode pattern to overlap the first electrode pattern, the second electrode pattern between the first insulating layer and the second insulating layer, the second electrode pattern spaced from the second lower electrode; and a third electrode pattern to overlap the first electrode pattern and the second electrode pattern between the second insulating layer and the substrate, the third electrode pattern spaced from the third lower electrode, wherein the first insulating layer has a trench configured to partially overlap an edge of the first electrode pattern.

14. The light emitting display device according to claim 13, wherein the second electrode pattern has a smaller width than the first electrode pattern.

15. The light emitting display device according to claim 14, wherein:

the third electrode pattern has a smaller width than the second electrode pattern.

16. The light emitting display device according to claim 13, wherein the first insulating layer comprises an inorganic insulating material.

17. The light emitting display device according to claim 13, further comprising first to third upper electrodes located on the first to third lower electrodes, respectively, wherein each of the first to third upper electrodes has a higher transmittance than a corresponding one of the first to third lower electrodes.

18. A light emitting display device comprising:

a substrate having a plurality of emission areas and a non-emission area between the plurality of emission areas;

a plurality of anodes at the plurality of emission areas, each anode comprising a lower electrode and an upper electrode, wherein the lower electrode in a certain emission area is located at a different vertical positions from lower electrodes in adjacent emission areas;

a first insulating layer on the lower electrode of at least one among the plurality of anodes; and an electrode pattern on the first insulating layer at the non-emission area between the plurality of emission areas, the electrode pattern horizontally spaced from the lower electrodes, respectively, wherein a lower surface of the electrode pattern has a higher vertical position than a lower surface of the upper electrode at each of the plurality of emission areas.

19. The light emitting display device according to claim 18, wherein the electrode pattern is provided as a same layer of the lower electrode of an anode at an emission area c to emit light of a shortest wavelength among the plurality of emission areas.

20. The light emitting display device according to claim 18, wherein an upper surface of the first insulating layer between the upper electrode and the electrode pattern is lower than the lower surface of the upper electrode.

* * * * *